(12) United States Patent
Yokoyama et al.

(10) Patent No.: US 10,998,223 B2
(45) Date of Patent: May 4, 2021

(54) METHOD FOR PROCESSING TARGET OBJECT

(71) Applicant: TOKYO ELECTRON LIMITED, Tokyo (JP)

(72) Inventors: Seiji Yokoyama, Miyagi (JP); Yasutaka Hama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 235 days.

(21) Appl. No.: 16/050,525

(22) Filed: Jul. 31, 2018

(65) Prior Publication Data
US 2019/0043753 A1 Feb. 7, 2019

(30) Foreign Application Priority Data

Aug. 3, 2017 (JP) .............................. JP2017-150927

(51) Int. Cl.
*H01L 21/768* (2006.01)
*H01L 21/033* (2006.01)
*H01L 21/311* (2006.01)

(52) U.S. Cl.
CPC .... *H01L 21/76807* (2013.01); *H01L 21/0337* (2013.01); *H01L 21/31116* (2013.01); *H01L 21/31138* (2013.01); *H01L 21/31144* (2013.01); *H01L 21/76811* (2013.01); *H01L 21/76813* (2013.01); *H01L 21/76826* (2013.01); *H01L 21/76843* (2013.01); *H01L 2221/1063* (2013.01)

(58) Field of Classification Search
None
See application file for complete search history.

(56) References Cited

U.S. PATENT DOCUMENTS

| | | | | |
|---|---|---|---|---|
| 6,300,240 B1* | 10/2001 | Linliu | ..................... | C23C 16/30 257/E21.029 |
| 9,184,054 B1* | 11/2015 | Huang | ................ | H01L 21/0337 |
| 2006/0189137 A1* | 8/2006 | Anderson | ......... | H01L 21/76831 438/691 |
| 2006/0286795 A1 | 12/2006 | Yosho | | |
| 2007/0200235 A1* | 8/2007 | Ohkura | ............. | H01L 21/31695 257/734 |

(Continued)

FOREIGN PATENT DOCUMENTS

| | | |
|---|---|---|
| JP | 2007-5379 A | 1/2007 |
| JP | 2007-123766 A | 5/2007 |
| JP | 2016-21546 A | 2/2016 |

*Primary Examiner* — Bo B Jang
(74) *Attorney, Agent, or Firm* — Rothwell, Figg, Ernst & Manbeck, P.C.

(57) ABSTRACT

In a method for processing a target object, the target object includes a wiring layer having a wiring, a diffusion barrier film provided on the wiring layer, an insulating film provided on the diffusion barrier film, and a metal mask provided on the insulating film and having an opening, and the insulating film has a trench formed at a part of a portion exposed through the opening and a first via hole provided at a part of the trench. The method includes: a first step of forming a sacrificial film on the trench and a side surface of the first via hole of the target object; and a second step of forming a second via hole at a deeper portion than a bottom surface of the first via hole by etching the sacrificial film and the insulating film and removing the sacrificial film from the trench and the first via hole.

11 Claims, 17 Drawing Sheets

(56) References Cited

U.S. PATENT DOCUMENTS

2008/0171433 A1* 7/2008 Huang .............. H01L 21/76811
    438/637
2009/0137125 A1   5/2009 Nozawa et al.
2011/0306214 A1* 12/2011 Zin ................... H01L 21/76802
    438/714
2017/0125255 A1   5/2017 Kakimotyo et al.

* cited by examiner

METHOD FOR PROCESSING TARGET OBJECT

CROSS-REFERENCE TO RELATED APPLICATIONS

This application claims priority to Japanese Patent Application No. 2017-150927 filed on Aug. 3, 2017, the entire contents of which are incorporated herein by reference.

FIELD OF THE INVENTION

The present disclosure relates to a method for processing a target object.

BACKGROUND OF THE INVENTION

Electronic components may use a semiconductor device having a multilayer wiring structure including an interlayer insulating film, a wiring provided in the interlayer insulating film and a via hole. In such a semiconductor device, miniaturization is advancing to improve a switching speed. Along with the miniaturization of semiconductor devices, miniaturization of a wiring trench and a via hole provided in the interlayer insulating film is also advancing, and various techniques for forming a fine trench or the like by etching are being developed (Japanese Patent Application Publication Nos. 2007-123766, 2007-5379 and 2016-21546). Japanese Patent Application Publication No. 2007-123766 discloses an etching method for etching a processing target layer such as an insulating film or the like formed on a surface of a target object such as a semiconductor wafer or the like. Japanese Patent Application Publication No. 2007-5379 discloses a method for manufacturing a semiconductor device having a dual damascene wiring using a low-k insulating interlayer film made of an organic insulating film. Japanese Patent Application Publication No. 2016-21546 discloses a substrate processing method for performing a desired etching process while suppressing a bowing shape.

When the miniaturization of the semiconductor devices is advancing, a lithography technique is used for forming a trench and a via hole. Therefore, the lithography technique may have limits in realizing miniaturization of the trench and the via hole while suppressing a dimensional deviation or the like. Further, along with the miniaturization of the semiconductor device, it is required to lower the dielectric constant of the interlayer insulating film. However, it is difficult to realize the miniaturization of the trench and the via hole while suppressing an increase in the dielectric constant of the insulating film. Accordingly, it is preferable to use a technique for forming a fine wiring and a fine via while suppressing the increase in the dielectric constant of the insulating film and the dimensional deviation.

SUMMARY OF THE INVENTION

In accordance with an aspect, there is provided a method for processing a target object. The target object includes a wiring layer having a wiring, a diffusion barrier film provided on the wiring layer, an insulating film provided on the diffusion barrier film, and a metal mask provided on the insulating film and having an opening. The insulating film has a trench formed at a part of a portion exposed through the opening and a first via hole provided at a part of the trench. The method includes: a first step of forming a sacrificial film on the trench and a side surface of the first via hole of the target object; and a second step of forming a second via hole at a deeper portion than a bottom surface of the first via hole by etching the sacrificial film and the insulating film and removing the sacrificial film from the trench and the first via hole.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
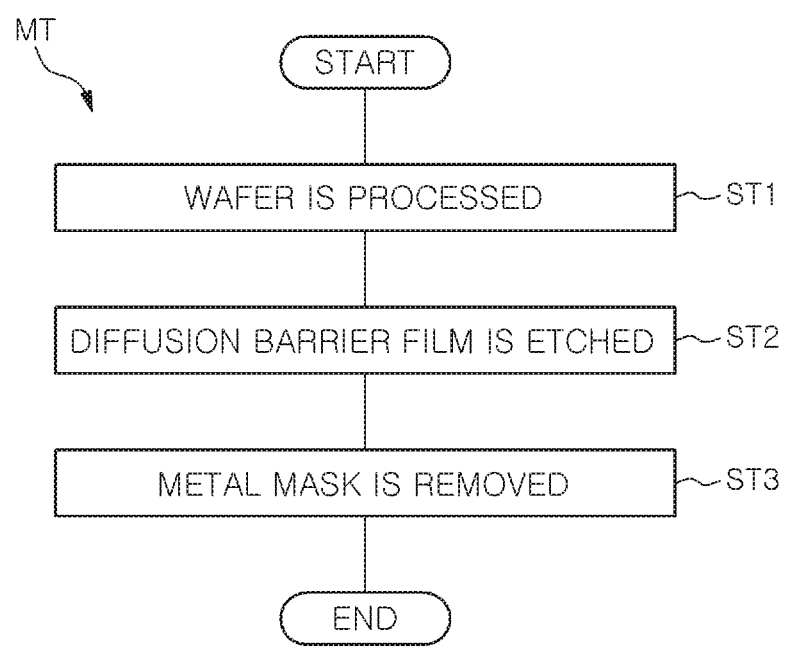
FIG. 1 is a flowchart showing an example of a method according to an embodiment.

Hereinafter, various embodiments will be described in detail with reference to the accompanying drawings. Like reference numerals will be given to like or corresponding parts throughout the drawings. FIG. 1 is a flowchart showing a method of processing a target object according to an embodiment. A method MT shown in FIG. 1 includes, particularly, processing of a target object which is performed before the target object is transferred to an atmospheric environment in manufacturing a multilayer wiring structure.

Figure 2:
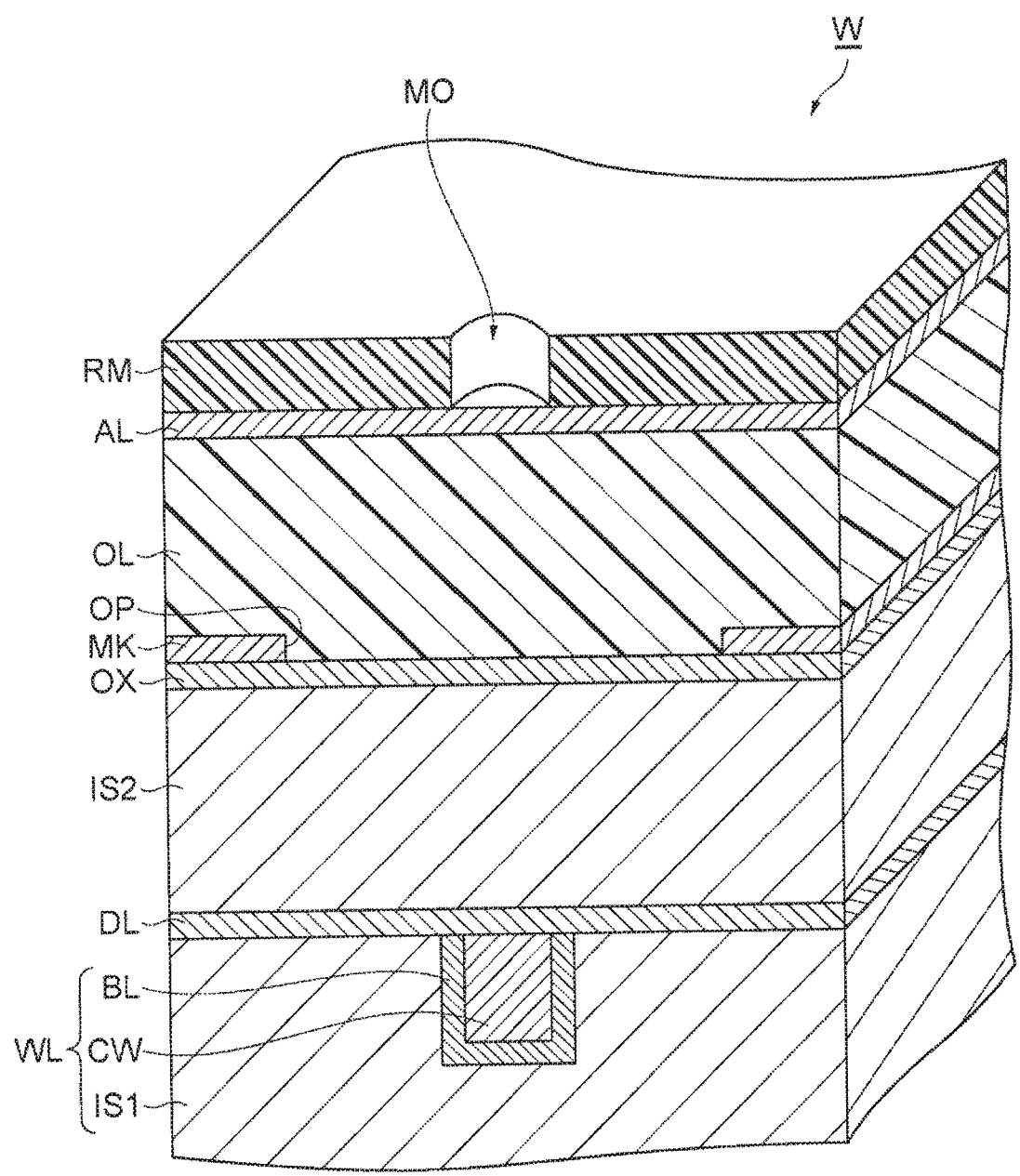
FIG. 2 is a cross sectional view showing a target object to which the method shown in FIG. 1 is applied.

FIG. 2 is a cross sectional view showing an example of the target object to which the method shown in FIG. 1 is applied. The target object shown in FIG. 2 (hereinafter, referred to as "wafer W") can be obtained in the process of manufacturing a multilayer wiring structure by using a dual damascene method. The wafer W is a substrate having a wiring layer WL. The wiring layer WL includes a first insulating film IS1, a barrier metal film BL, and a wiring CW. The wafer W further has a diffusion barrier film DL, a second insulating film IS2, an oxide film OX, a metal mask MK, an organic layer OL, an anti-reflection film AL, and a resist mask RM.

The first insulating film IS1 is made of an insulating material and/or a low-k material. The first insulating film IS1 is, e.g., a monolayer film made of $SiO_2$ that is an example of an insulating material or SiOCH that is an example of a low-k material, a multilayer film including an insulating material film and a low-k film, or a multilayer film including a plurality of low-k films. A trench is formed in the first insulating film IS1. The wiring CW is buried in the trench of the first insulating film IS1. The wiring CW is made of, e.g., a metal such as copper or the like. The barrier metal film BL is provided between a surface of the first insulating film IS1 which defines the trench and the wiring CW. The barrier metal film BL is made of, e.g., a metal such as Ta, TaN or the like. The material of the wiring CW is not limited to copper or the like, and Ti, TiN or the like may be used. In that case, the barrier metal film BL is made of, e.g., a metal such as tungsten, cobalt, or the like.

The diffusion barrier film DL is provided on the wiring layer WL. The diffusion barrier film DL may be made of, e.g., SiC, SiCN, SiN or the like. Further, the diffusion barrier film DL may be a multilayer film including a plurality of films, each being made of SiC, SiCN, or SiN.

The second insulating film IS2 is provided on the diffusion barrier film DL. In one embodiment, the second insulating film IS2 has low-k characteristics. The second insulating film IS2 may be a silicon oxide film, a silicon-containing film having low-k characteristics, or a film formed by laminating a silicon oxide film and a silicon-containing film having low-k characteristics. For example, the second insulating film IS2 may be a monolayer film of SiOCH, a multilayer film including a silicon oxide film ($SiO_2$) and a low-k film, or a multilayer film including a plurality of low-k films. Further, the second insulating film IS2 is not limited to a film having low-k characteristic, and may be a monolayer film of a silicon oxide film ($SiO_2$).

Figure 15:
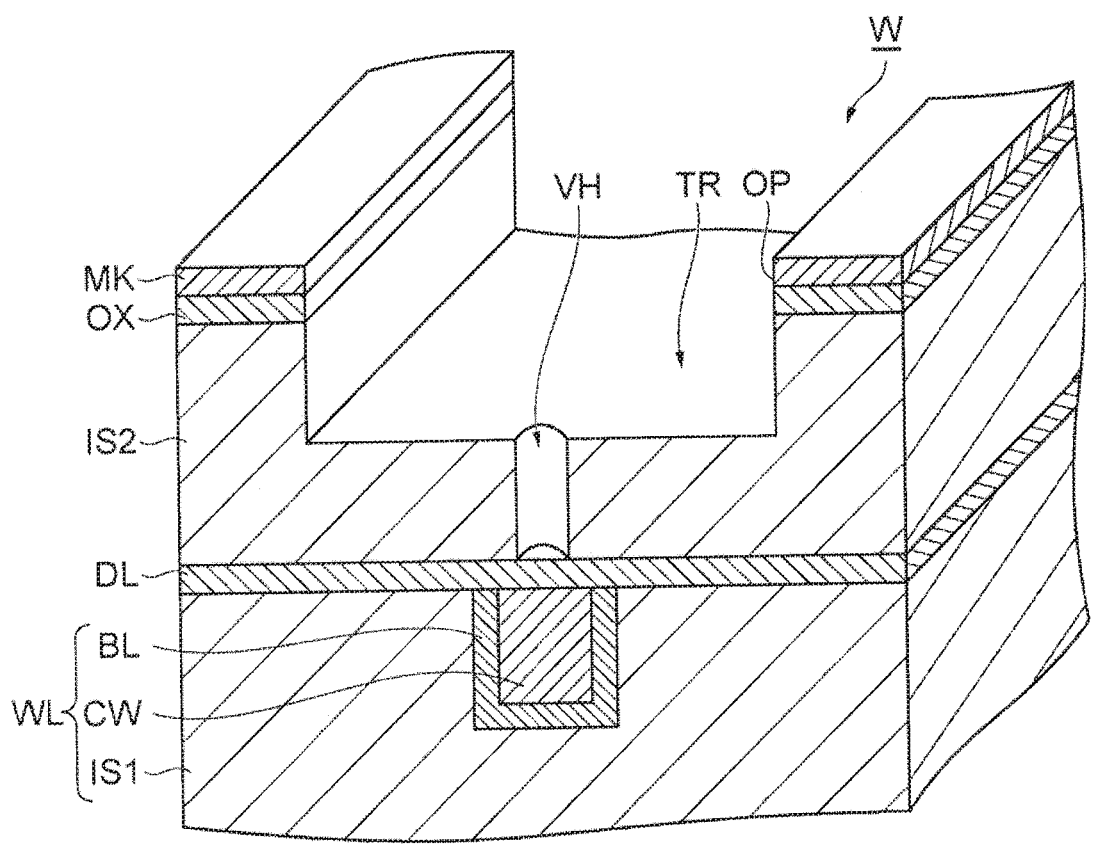

The oxide film OX is provided on the second insulating film IS2. The oxide film OX is an insulating film. The oxide film OX may be, e.g., a silicon oxide film ($SiO_2$) formed by a CVD method using a TEOS gas. The metal mask MK is provided on the oxide film OX (on the second insulating film IS2). The metal mask MK provides an opening OP and has a pattern provided by the opening OP, i.e., a pattern transferred to the second insulating film IS2. In this manner, the opening OP corresponding to the trench (the trench TR shown in FIGS. 15 and 16) formed in the second insulating film IS2 is formed in the metal mask MK. The metal mask MK may be made of, e.g., titanium (Ti) or titanium nitride (TiN).

The organic layer OL is provided to cover the metal mask MK and fill the opening of the metal mask MK. The anti-reflection film AL is provided on the organic layer OL. The resist mask RM is provided on the anti-reflection film AL. The resist mask RM has a pattern provided by the opening MO, i.e., a pattern to be transferred to the second insulating film IS2. In this manner, the opening MO corresponding to the via hole (the via hole VH shown in FIGS. 15 and 16) formed in the second insulating film IS2 is formed in the resist mask RM.

Figure 3:
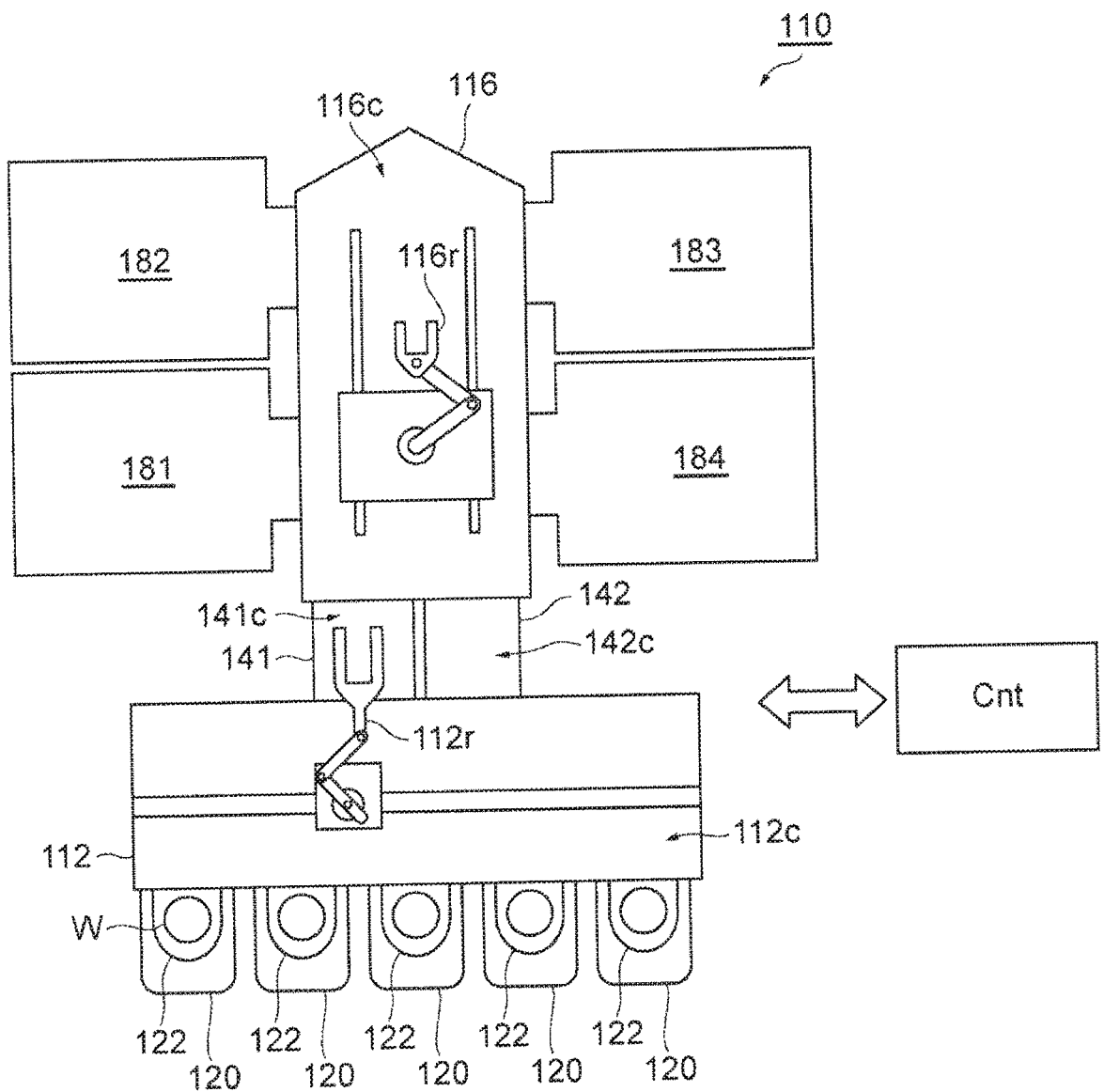
FIG. 3 schematically shows an example of a substrate processing system and a cleaning apparatus which can be used for implementing the method shown in FIG. 1.

FIG. 3 schematically shows an example of a substrate processing system that can be used for implementing the method shown in FIG. 1. The substrate processing system 110 shown in FIG. 3 includes a loader module 112, load-lock modules 141 and 142, a transfer module 116, and a plurality of process modules (the process module 181, the process module 182, the process module 183, the process module 184 and the like).

The loader module 112 transfers a wafer W under an atmospheric environment. A plurality of stages 120 is attached to the loader module 112. A FOUP 122 capable of accommodating a plurality of wafers is mounted on each of the stages 120. In the FOUP 122, the wafers are stored under the atmospheric environment.

The loader module 112 has a transfer robot 112r. The transport robot 112r is provided in a transfer chamber 112c of the loader module 112. The transfer chamber 112c is provided in the loader module 112. The load-lock modules 141 and 142 are connected to the loader module 112. The transfer robot 112r can transfer the wafer W between the FOUP 122 and the load-lock module 141 or 142.

The load-lock modules 141 and 142 have preliminary depressurization chambers 141c and 142c, respectively. The transfer module 116 is connected to the load-lock modules 141 and 142. The transfer module 116 provides a depressurizable transfer chamber 116c. A transfer robot 116r is provided in the transfer chamber 116c. The process modules 181 to 184 are connected to the transfer module 116. The transfer robot 116r of the transfer module can transfer the wafer W between any one of the load-lock modules 141 and 142 and one of the process modules 181 to 184 and between any two process modules among the plurality of process modules 181 to 184.

Each of the process modules 181 to 184 serves as a substrate processing apparatus for performing a dedicated process for the wafer W. A plasma processing apparatus 10 shown in FIG. 4 is used for one of the process modules 181 to 184.

In one embodiment, the substrate processing system 110 further includes a control unit Cnt. The control unit Cnt is a computer including a processor, a storage unit, an input device, a display device or the like, and integrally controls the respective components of the substrate processing system 110, such as the operations of the transfer robots 112r and 116r, the operations of the respective units of the process modules (the process modules 181 to 184) and the like. Especially, the control unit Cnt controls the operations of the respective components of the substrate processing system 110 which are related to the execution of the method MT. The control unit Cnt allows an operator to input commands for managing the substrate processing system 110 by using the input device, and also allows the display device to visualize and display the operation state of the substrate processing system 110. The storage unit of the control unit Cnt stores a control program for controlling various processes executed by the substrate processing system 110 by a processor, and a program, i.e., a processing recipe, for performing processes of the respective components of the substrate processing system 110 under processing conditions. The control program and the process recipe related to execution of the method MT are stored in the storage unit of the control unit Cnt.

Figure 4:
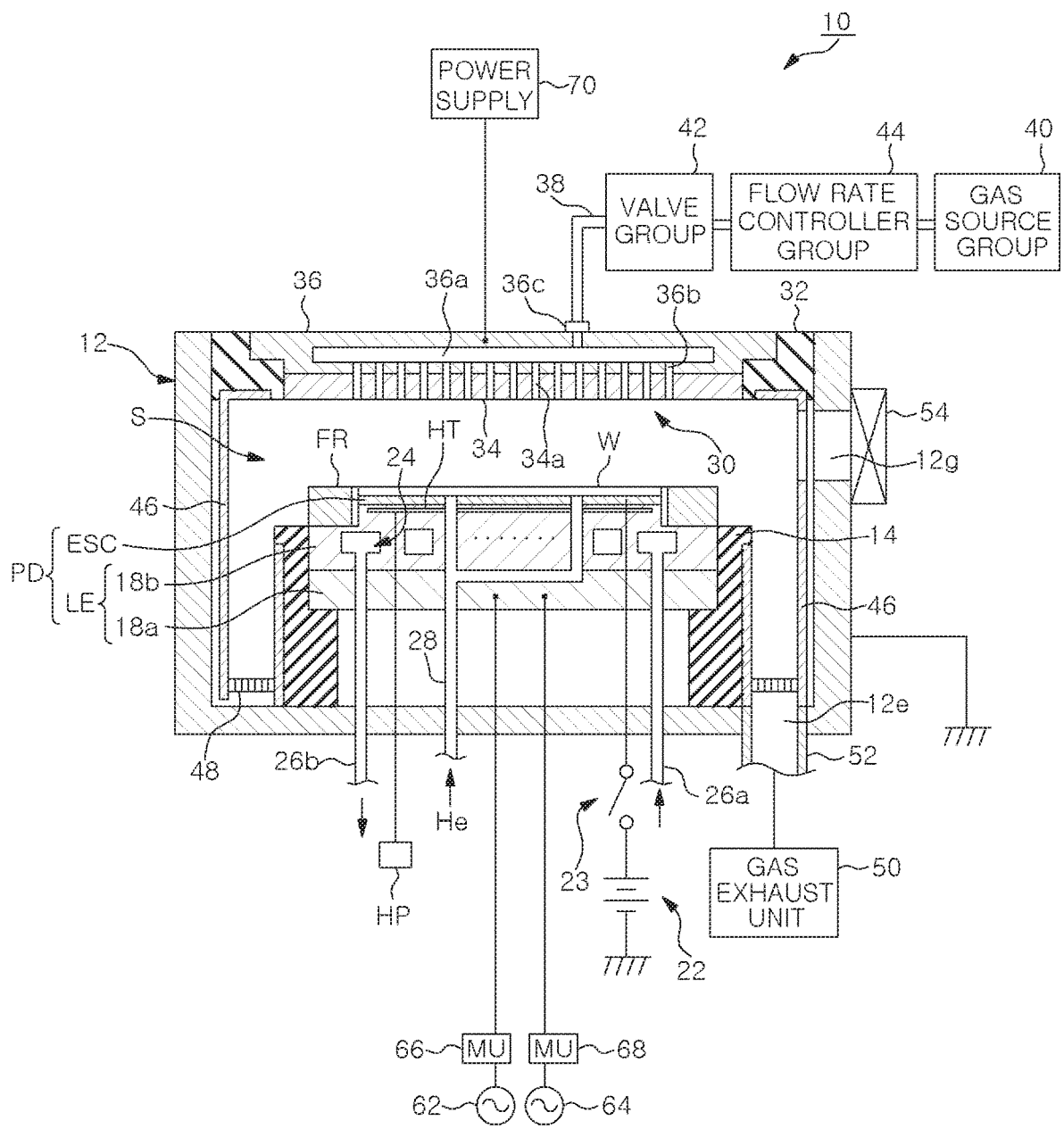
FIG. 4 schematically shows an example of a plasma processing apparatus that can be used to implement the method shown in FIG. 1.

FIG. 4 schematically shows an example of a plasma processing apparatus that can be used for implementing the method shown in FIG. 1. The plasma processing apparatus 10 shown in FIG. 4 is a capacitively coupled plasma processing apparatus and includes a substantially cylindrical processing chamber 12. The processing chamber 12 is made of, e.g., aluminum. An inner wall surface of the processing chamber 12 is made of anodically oxidized aluminum. The processing chamber 12 is frame grounded.

A substantially cylindrical supporting member 14 is provided on a bottom portion of the processing chamber 12. The supporting member 14 is made of, e.g., an insulating material. When the plasma processing apparatus 10 is installed such that the bottom portion of the processing chamber 12 extends along a horizontal plane, the supporting member 14 extends vertically from the bottom portion of the processing chamber 12 in the processing chamber 12. A mounting table PD is provided in the processing chamber 12. The mounting table PD is supported by the supporting member 14.

The mounting table PD is configured to hold the wafer W on the top surface thereof. The mounting table PD has a lower electrode LE and an electrostatic chuck ESC. The lower electrode LE includes a first plate 18a and a second plate 18b. The first plate 18a and the second plate 18b are made of a metal, e.g., aluminum or the like, and have a substantially disk shape. The second plate 18b is provided on the first plate 18a and is electrically connected to the first plate 18a.

The electrostatic chuck ESC is provided on the second plate 18b. The electrostatic chuck ESC has a structure in which an electrode of a conductive film is interposed between two insulating layers or sheets. A DC power supply 22 is electrically connected to the electrode of the electrostatic chuck ESC via a switch 23. The electrostatic chuck ESC attracts and holds the wafer W by electrostatic force such as Coulomb for or the like which is generated by a DC voltage from the DC power supply 22. Accordingly, the electrostatic chuck ESC can hold the wafer W thereon.

A focus ring FR is provided on the peripheral portion of the second plate 18b to surround the edges of the wafer W and the electrostatic chuck ESC. The focus ring FR is provided to improve uniformity of plasma processing on the wafer. The focus ring FR may be made of a material that is appropriately selected depending on the plasma treatment, e.g., silicon (S), SiC, quartz, or the like.

A coolant flow path 24 is provided in the second plate 18b. The coolant flow path 24 constitutes a temperature control mechanism. A coolant is supplied to the coolant flow path 24 from a chiller unit (not shown) provided outside the processing chamber 12 through a line 26a. The coolant supplied to the coolant flow path 24 is returned to the chiller unit through a line 26b. In this manner, the coolant is circulated between the coolant flow path 24 and the chiller unit. By controlling the temperature of the coolant, the temperature of the wafer W held on the electrostatic chuck ESC is controlled.

A heater HT is a heating element and embedded in the second plate 18b, for example. A heater power supply HP is connected to the heater HT. By supplying power from the heater power supply HP to the heater HT, the temperature of the mounting table PD is controlled and, further, the temperature of the wafer W mounted on the mounting table PD is controlled. The heater HT may be provided in the electrostatic chuck ESC.

The plasma processing apparatus 10 is provided with a gas supply line 28. The gas supply line 28 supplies a heat transfer gas, e.g., He gas, from a heat transfer gas supply mechanism (not shown) to a gap between the upper surface of the electrostatic chuck ESC and the backside of the wafer W. The plasma processing apparatus 10 includes an upper electrode 30. The upper electrode 30 is provided above the mounting table. A processing space S for performing plasma processing on the wafer W is provided between the upper electrode 30 and the mounting table PD.

The upper electrode 30 is supported at an upper portion of the processing chamber 12 through an insulating shielding member 32. The upper electrode 30 may include a top plate 34 and a holder 36. The top plate 34 faces the processing space S, and a plurality of gas injection holes 34a is formed in the top plate 34. The top plate 34 is made of silicon in one embodiment.

The holder 36 detachably holds the top plate 34, and may be made of a conductive material, e.g., aluminum or the like. The holder 36 may have a water-cooling structure. A gas diffusion space 36a is provided in the holder 36. A plurality of gas holes 36b communicating with the gas injection holes 34a extends downward from the gas diffusion space 36a. A gas inlet port 36c for guiding a processing gas to the gas diffusion space 36a is formed in the holder 36, and a gas supply line 38 is connected to the gas inlet port 36c.

A gas source group 40 is connected to the gas supply line 38 through a valve group 42 and a flow rate controller group 44. The gas source group 40 includes a plurality of gas sources. In one example, the gas source group 40 includes one or more fluorocarbon gas sources, one or more hydrofluorocarbon gas sources, a hydrocarbon gas source, a rare gas source, a nitrogen gas ($N_2$ gas) source, a hydrogen gas ($H_2$ gas) source, one or more oxygen-containing gas sources, and a silicon-containing gas source. In one example, one or more fluorocarbon gas sources may include a $C_4F_8$ gas source, a $CF_4$ gas source, a $C_4F_6$ gas source and a $C_5F_8$ gas source. In one example, one or more hydrofluorocarbon gas sources may include a $CHF_3$ gas source a $CH_2F_2$ gas source and a $CH_3F$ gas source. In one example, the hydrocarbon gas source may include a $CH_4$ gas source, a $C_2H_2$ gas source, a $C_2H_4$ gas source, a $C_2H_6$ gas source, a $C_3H_4$ gas source, a $C_3H_6$ gas source, a $C_3H_8$ gas source, a $C_4H_4$ gas source, a $C_4H_6$ gas source, a $C_4H_8$ gas source, or a $C_4H_{10}$ gas source. The rare gas source may be a source of any rare gas such as He gas, Ne gas, Ar gas, Kr gas, Xe gas or the like. In one example, the rare gas source is an Ar gas source. In one example, one or more oxygen-containing gas sources include an oxygen gas ($O_2$ gas) source. One or more oxygen-containing gas sources may further include a CO gas source and/or a $CO_2$ gas source. In one example, the silicon-containing gas may include an aminosilane gas, a silicon alkoxide-based gas, and a silicon halide.

The valve group 42 includes a plurality of valves, and the flow rate controller group 44 includes a plurality of flow rate controllers such as a mass flow controller and the like. The plurality of gas sources of the gas source group is connected to the gas supply line 38 through corresponding valves of the valve group 42 and corresponding flow rate controllers of the flow rate control group 44.

In the plasma processing apparatus 10, a deposition shield 46 is detachably provided along an inner surface of a sidewall of the processing chamber 12. The deposition shield 46 is also provided at an outer periphery of the supporting member 14. The deposition shield 46 prevents etching by-products from being adhered to the wall surface such as the inner surface of the sidewall of the processing chamber 12 and the like. The deposition shield 46 may be formed by coating ceramic such as $Y_2O_3$ or the like on an aluminum base material.

At a lower portion in the processing chamber 12, a gas exhaust plate 48 having a plurality of through-holes is provided between the supporting member 14 and the sidewall of the processing chamber 12. The gas exhaust plate 48 may be formed by coating ceramic such as $Y_2O_3$ or the like on an aluminum base material, for example. A gas exhaust port 12e is provided at the processing chamber 12 to be positioned below the gas exhaust plate 48. A gas exhaust unit 50 is connected to the gas exhaust port 12e through a gas exhaust line 52. The gas exhaust unit 50 includes a vacuum pump such as a turbo molecular pump or the like, and thus can decrease a pressure in a space in the processing chamber 12 to a desired vacuum level. A loading/unloading port 12g for the wafer W is provided at the sidewall of the processing chamber 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power, which has a frequency of, e.g., 27 to 100 MHz, for plasma generation. The first high frequency power supply 62 is connected to the lower electrode LE via a matching unit (MU) 66. The matching unit 66 includes a circuit for matching an output impedance of the first high frequency power supply 62 and an input impedance of a load side. The first high frequency power supply 62 may be connected to the upper electrode 30 via the matching unit 66.

The second high frequency power supply 64 generates a second high frequency power, which has a high frequency of, e.g., 400 kHz to 13.56 MHz, for attracting ions to the wafer W. The second high frequency power supply 64 is connected to the lower electrode LE via a matching unit (MU) 68. The matching unit 68 includes a circuit for matching an output impedance of the second high frequency power supply 64 and the input impedance of the load side.

The plasma processing apparatus 10 further includes a power supply 70. The power supply 70 is connected to the upper electrode 30. The power supply 70 applies to the upper electrode 30 a voltage for attracting positive ions existing in the processing space S into the top plate 34. In one example, the power supply 70 is a DC power supply for generating a negative DC voltage. In another example, the power supply 70 may be an AC power supply for generating an AC voltage of a relatively low frequency.

Hereinafter, the method MT will be described in detail with reference to FIG. 1. In the following description, an example in which the wafer W shown in FIG. 2 is processed by using the substrate processing system 110 having the plasma processing apparatus 10 shown in FIG. 4 as one process module will be described. In the following description, FIGS. 8 to 16 will be referred to. FIGS. 8 to 16 are enlarged cross sectional views showing a part of the target object during the implementation of the method shown in FIG. 1.

First, in the method MT, the wafer W shown in FIG. 2 is transferred from the FOUP 122 into the process module, i.e., the processing chamber 12 of the plasma processing apparatus 10, through the loader module 112, the load-lock module 141 or 142, and the transfer module 116. The wafer W loaded into the processing chamber 12 is mounted on the mounting table PD and held thereon. The method MT (in particular, from a step ST1c to a step ST1e to be described later) is executed in a consistent vacuum environment. The method MT is executed in a single processing chamber 12 (in the same process module). In one embodiment, in the method MT, a processing chamber (process module) for performing a process related to etching and a processing chamber (process module) for performing a process related to film formation may be separately used. In that case as well, the method MT (in particular, from the step ST1c to the step ST1e to be described later) is executed in a consistent vacuum environment.

Figure 5:
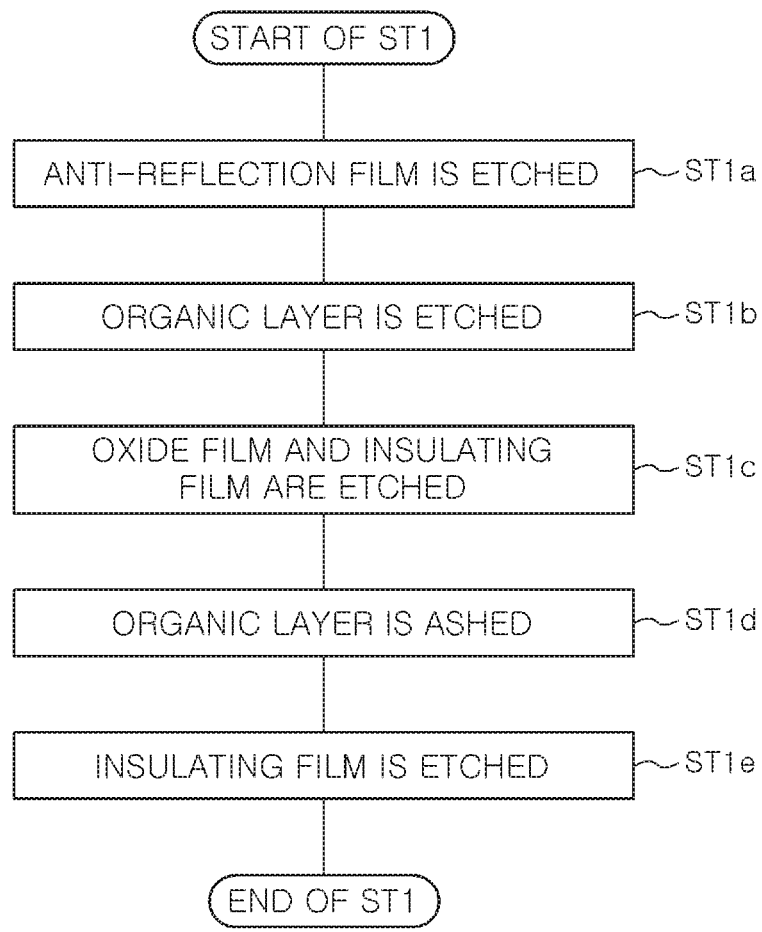
FIG. 5 is a flowchart showing a specific example of a step ST1 shown in FIG. 1.

Then, in the method MT, a step ST1 is executed. In the step ST1, the wafer W is processed to be in a state where processing of a step ST2 can be applied. In the step ST1, the anti-reflection film AL, the organic layer OL, the oxide film OX, and the second insulating film IS2 are etched. Hereinafter, the step ST1 will be described in detail. FIG. 5 is a flowchart showing a specific example of the step ST1.

As shown in FIG. 5, the step ST1 includes steps ST1a, ST1b, ST1c, ST1d and ST1e. In the step ST1, first, the step ST1a is executed. In the step ST1a, a portion of the anti-reflection film AL, which is exposed through the opening MO of the resist mask RM, is etched. Therefore, in the step ST1a, a processing gas is supplied into the processing chamber 12 from a gas source selected among the plurality of gas sources of the gas source group 40. The processing gas may include, e.g., a fluorocarbon gas, a hydrofluorocarbon gas, and oxygen gas. As for the fluorocarbon gas, $CF_4$ gas may be used, for example. As for the hydrofluorocarbon gas, $CHF_3$ gas may be used, for example. In the step ST1a, the gas exhaust unit 50 is operated to set the pressure in the processing chamber 12 to a predetermined level. In the step ST1a, the first high frequency power from the first high frequency power supply 62 and the second high frequency power from the second high frequency power supply 64 are supplied to the lower electrode LE.

Figure 8:
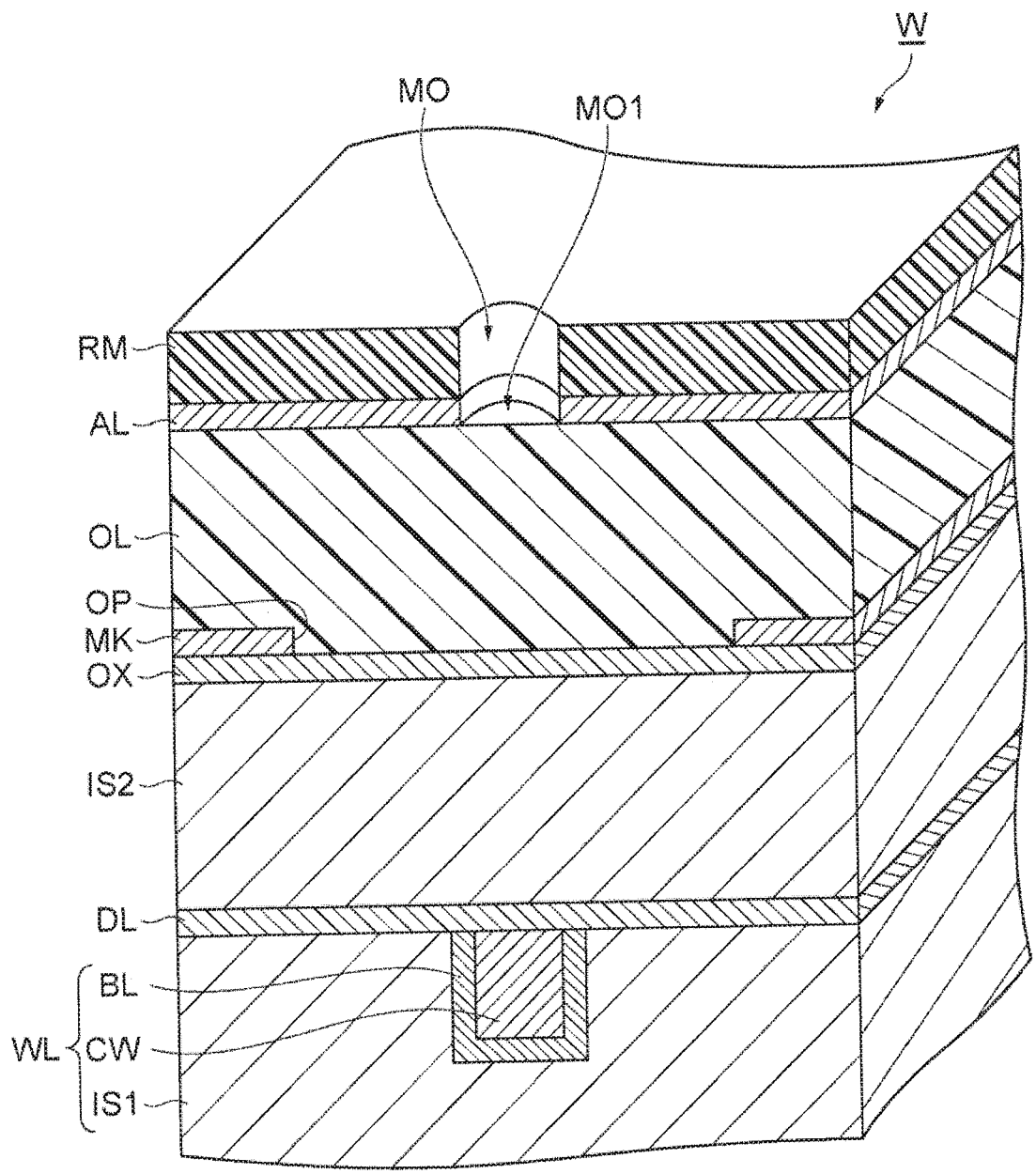
FIGS. 8 to 16 are enlarged cross sectional views showing a part of a target object during the implementation of the method shown in FIG. 1.

In the step ST1a, plasma of the processing gas is generated, and the portion of the anti-reflection film AL exposed through the opening MO of the resist mask RM is etched at a portion. As a result, as shown in FIG. 8, the portion of the anti-reflection film AL which is exposed through the opening MO of the resist mask RM is removed, and an opening MO1 is formed in the anti-reflection film AL.

After the step ST1a, the step ST1b is executed. In the step ST1b, the organic layer OL is etched. Therefore, in the step ST1b, a processing gas is supplied into the processing chamber 12 from a gas source selected among the plurality of gas sources of the gas source group 40. In the step ST1b of one example, a processing gas including oxygen gas and carbon monoxide gas is supplied into the processing chamber 12 and, then, a processing gas including hydrogen gas and nitrogen gas is supplied into the processing chamber 12. In the step ST1b, the gas exhaust unit 50 is operated to set the pressure in the processing chamber 12 to a predetermined level. In step ST1b, the first high frequency power is supplied from the first high frequency power supply 62 to the lower electrode LE.

Figure 9:
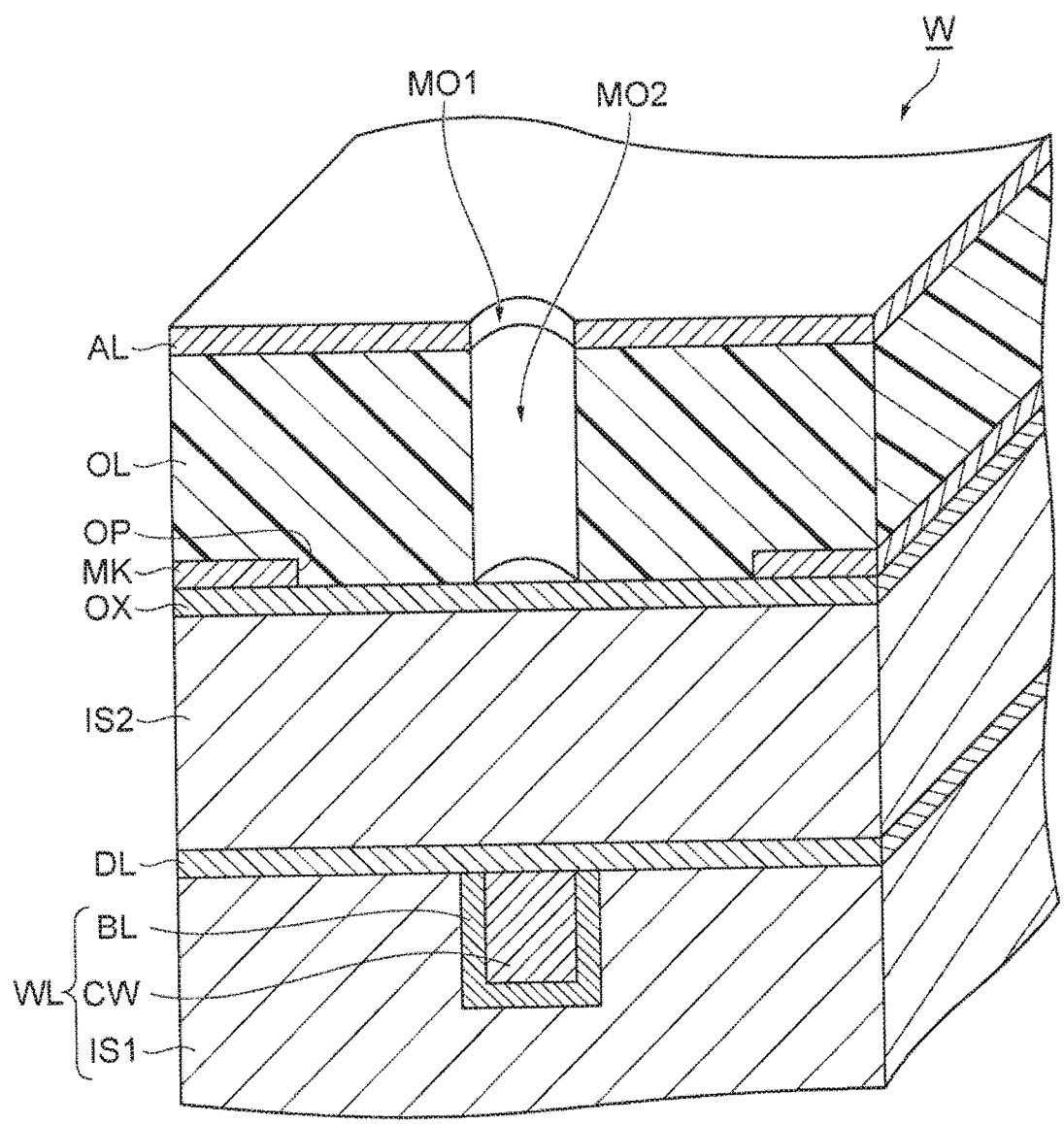

In the step ST1b, a plasma of the processing gas is generated, a portion of the organic layer OL, which is exposed through the opening MO1, is etched. At this time, the resist mask RM is also etched. As a result, as shown in FIG. 9, the portion of the organic layer OL which is exposed from the opening MO1 is removed, and an opening MO2 is formed in the organic layer OL.

In the present embodiment, the resist mask RM having the pattern provided by the opening MO is used. However, the present disclosure is not limited thereto as long as the opening MO2 is formed in the organic layer OL. For example, the organic layer OL may be etched by using a metal mask made of tungsten or the like which has a pattern provided on the organic layer OL, and then the metal mask made of tungsten or the like may be removed.

After the step ST1b, the step ST1c is executed. In the step ST1c, the oxide film OX and the second insulating film IS2 are etched. To that end, a processing gas is supplied into the processing chamber 12 from a gas source selected among the plurality of gas sources of the gas source group 40. In the step ST1c of one example, a processing gas including a fluorocarbon gas is supplied into the processing chamber 12 and, then, a processing gas including a hydrofluorocarbon gas, nitrogen gas and oxygen gas is supplied into the processing chamber 12. As for the fluorocarbon gas, $CF_4$ gas and $C_4F_8$ gas may be used, for example. As for the hydrofluorocarbon gas, $CH_2F_2$ gas may be used, for example. In the step ST1c, the gas exhaust unit 50 is operated to set the pressure in the processing chamber 12 to a predetermined level. In the step ST1c, the first high frequency power from the first high frequency power supply 62 and the second high frequency power from the second high frequency power supply 64 are supplied to the lower electrode LE.

Figure 10:
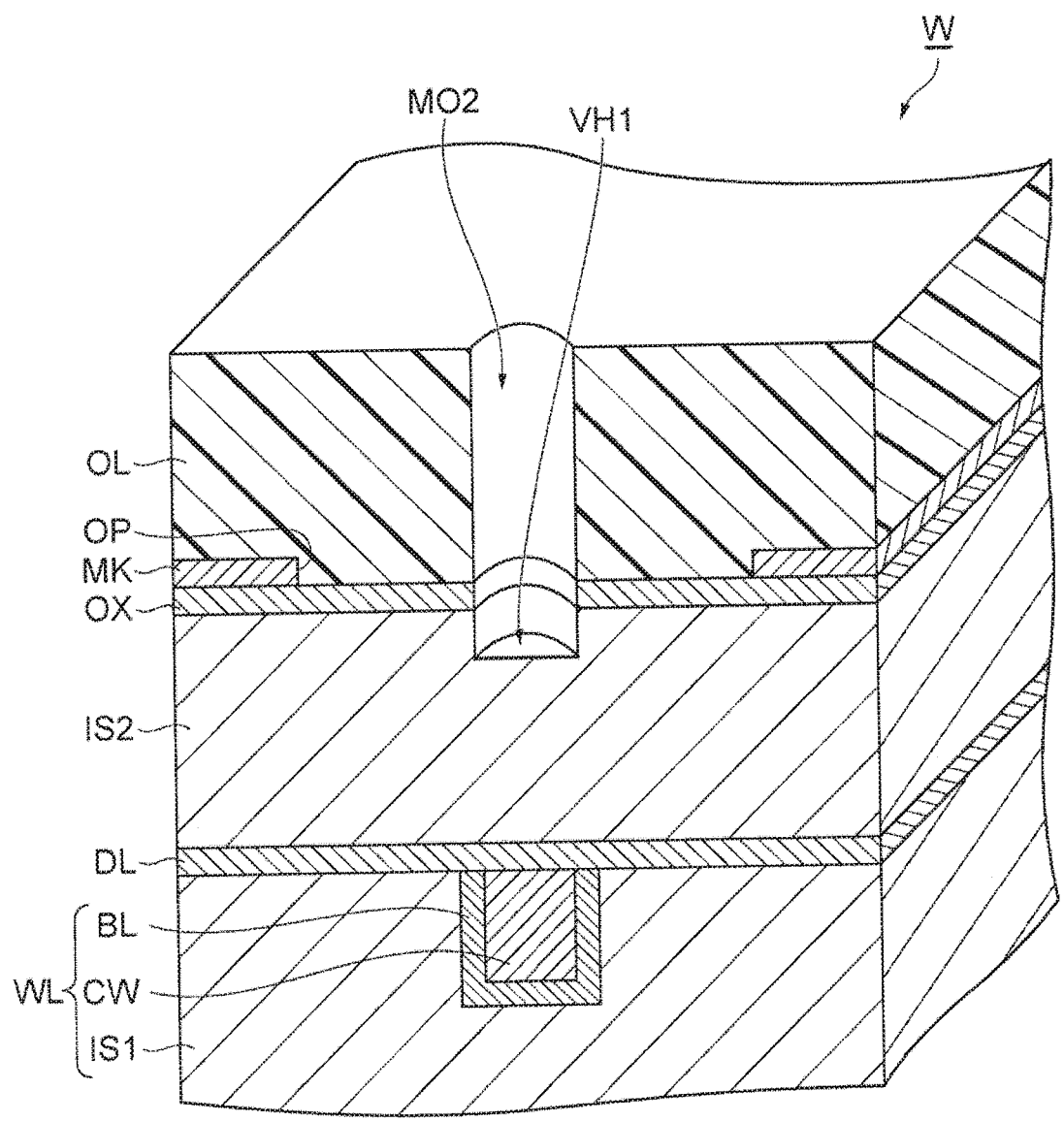

In step ST1c, plasma of the processing gas is generated, and the oxide film OX and the second insulating film IS2 are etched. The second insulating film IS2 is etched to some extent in its thickness direction. In the step ST1c, the anti-reflection film AL is also etched. As a result, as shown in FIG. 10, among the entire region of the oxide film OX and the entire region of the second insulating film IS2, a portion exposed through the opening MO2 is removed to form an opening in the oxide film OX and form a via hole VH1 (first via hole) in the second insulating film IS2. The via hole VH1 is formed at a part of the portion of the second insulating film IS2 which is exposed through the opening OP of the metal mask MK (including the center of the portion exposed through the opening OP). In the step ST1c, the anti-reflection film AL is removed, and the film thickness of the organic layer OL is slightly reduced.

After the step ST1c, the step ST1d is executed. In the step ST1d, the organic layer OL is removed. Therefore, a processing gas is supplied into the processing chamber 12 from a gas source selected among the plurality of gas sources of the gas source group 40. The processing gas may include carbon dioxide gas. In the step ST1d, the gas exhaust unit 50 is operated to set the pressure in the processing container 12 to a predetermined level. In the step ST1d, the first high frequency power is supplied from the first high frequency power supply 62 to the lower electrode LE.

Figure 11:
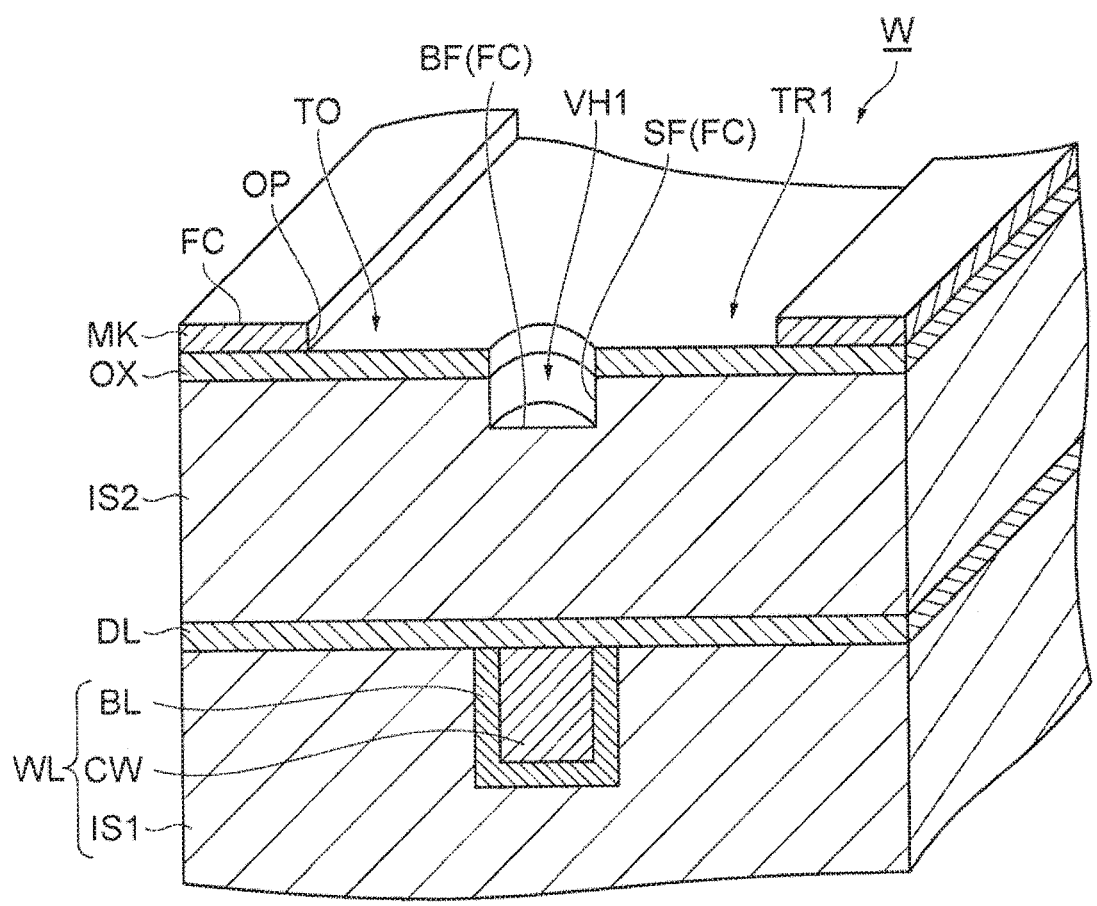

In the step ST1d, plasma of the processing gas is generated and the organic layer OL is ashed. As a result, as shown in FIG. 11, the organic layer OL is removed and the metal mask MK is exposed. As a result of the step ST1d, an exposed surface FC of the wafer W includes a surface of the exposed metal mask MK, a surface of the oxide film OX, and a side surface SF and a bottom surface BF of the via hole VH1. The metal mask MK having the opening OP provides an opening TO on the surface of the oxide film OX. Accordingly, a trench TR1 is formed by the opening OP of the metal mask MK and the opening TO on the surface of the oxide film OX, and the via hole VH1 is formed at a part of the trench TR1. In the configuration shown in FIG. 11, the opening OP of the metal mask MK has a width greater than that of the via hole VH1. However, the present disclosure is not limited thereto, and the width of the opening OP may be equal to or smaller than that of the via hole VH1. In the case where the via hole VH1 is smaller than that of the via hole VH1, when the step ST1c is executed, the oxide film OX and the second insulating film IS2 are etched and, at the same time, a part of the metal mask MK is etched. As a consequence, a width of the etched portion of the metal mask MK becomes equal to that of the via hole VH1.

Figure 6:
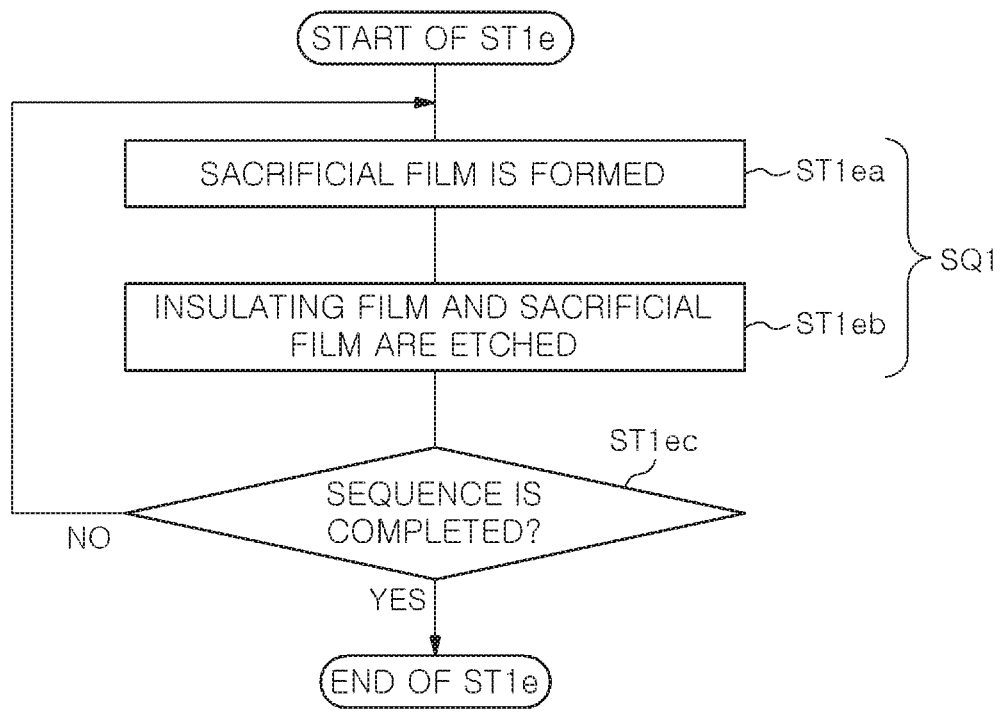
FIG. 6 is a flowchart showing a specific example of a step ST1e shown in FIG. 5.

After the step ST1d, the step She is executed. In the step ST1e, the second insulating film IS2 is etched. Hereinafter, the step She will be described in detail. FIG. 6 is a flowchart showing a specific example of the step She shown in FIG. 5. As shown in FIG. 6, the step She includes a sequence SQ1 and a step ST1ec. The sequence SQ1 includes a step ST1ea (first step) and a step ST1eb (second step).

Figure 12:
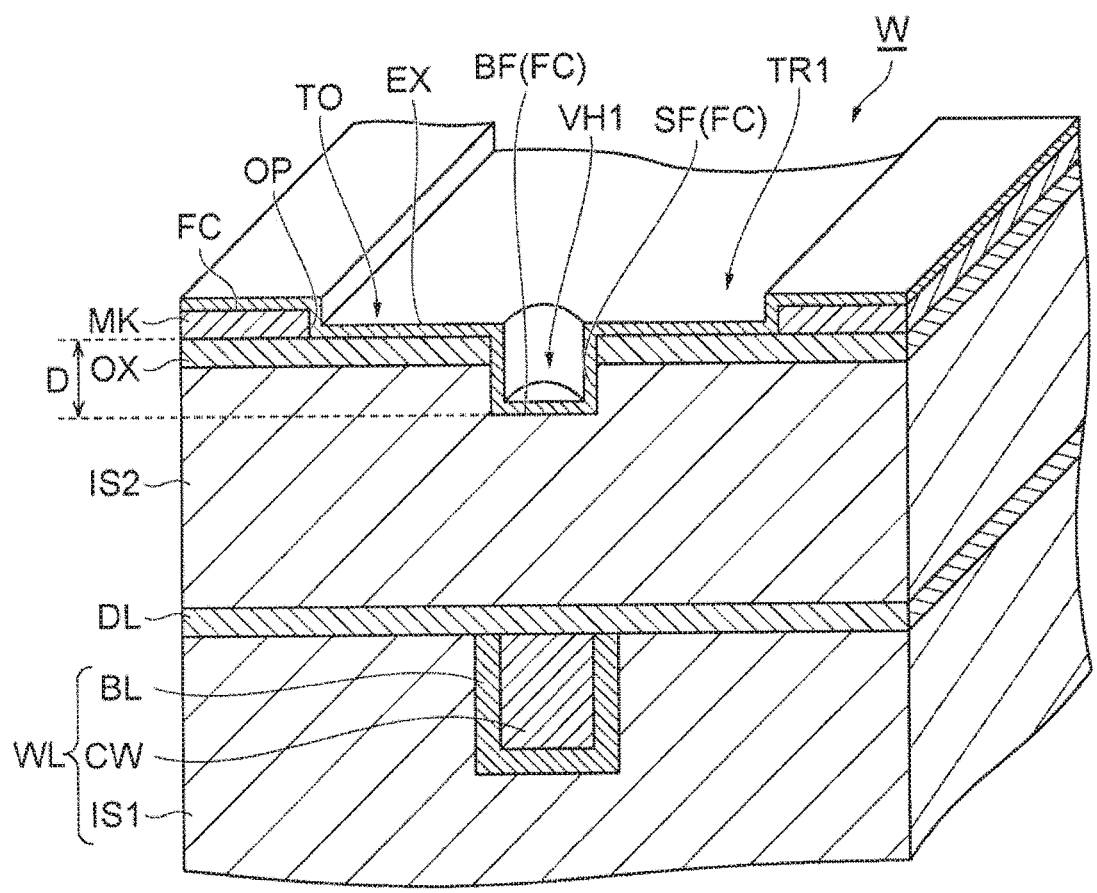

In the step ST1e, first, the step ST1ea is executed. In the step ST1ea, as shown in FIG. 12, a sacrificial film EX is formed on the trench TR1 of the wafer W provided in the processing chamber 12 of the plasma processing apparatus 10 and the side surface SF of the via hole VH1. In one embodiment, the sacrificial film EX is a silicon oxide film.

Further, the sacrificial film EX may have low-k characteristics, for example. In the step ST1eb, the sacrificial film EX, the oxide film OX, and the second insulating film IS2 are etched at the same time. Since it is preferable that the sacrificial film EX, the oxide film OX, and the second insulating film IS2 have substantially the same etching rate, the sacrificial film EX is preferably made of a material contained in the oxide film OX or the second insulating film IS2. Although the sacrificial film EX is etched in the step ST1eb, the sacrificial film EX may remain. In that case, the remaining sacrificial film EX becomes a part of the second insulating film IS2 in a subsequence step and may cause an increase in the dielectric constant of the insulating film. From this aspect, it is preferable that the sacrificial film EX is made of a material contained in the oxide film OX or the second insulating film IS2. In step ST1ea, the sacrificial film EX is conformally formed.

Figure 7:
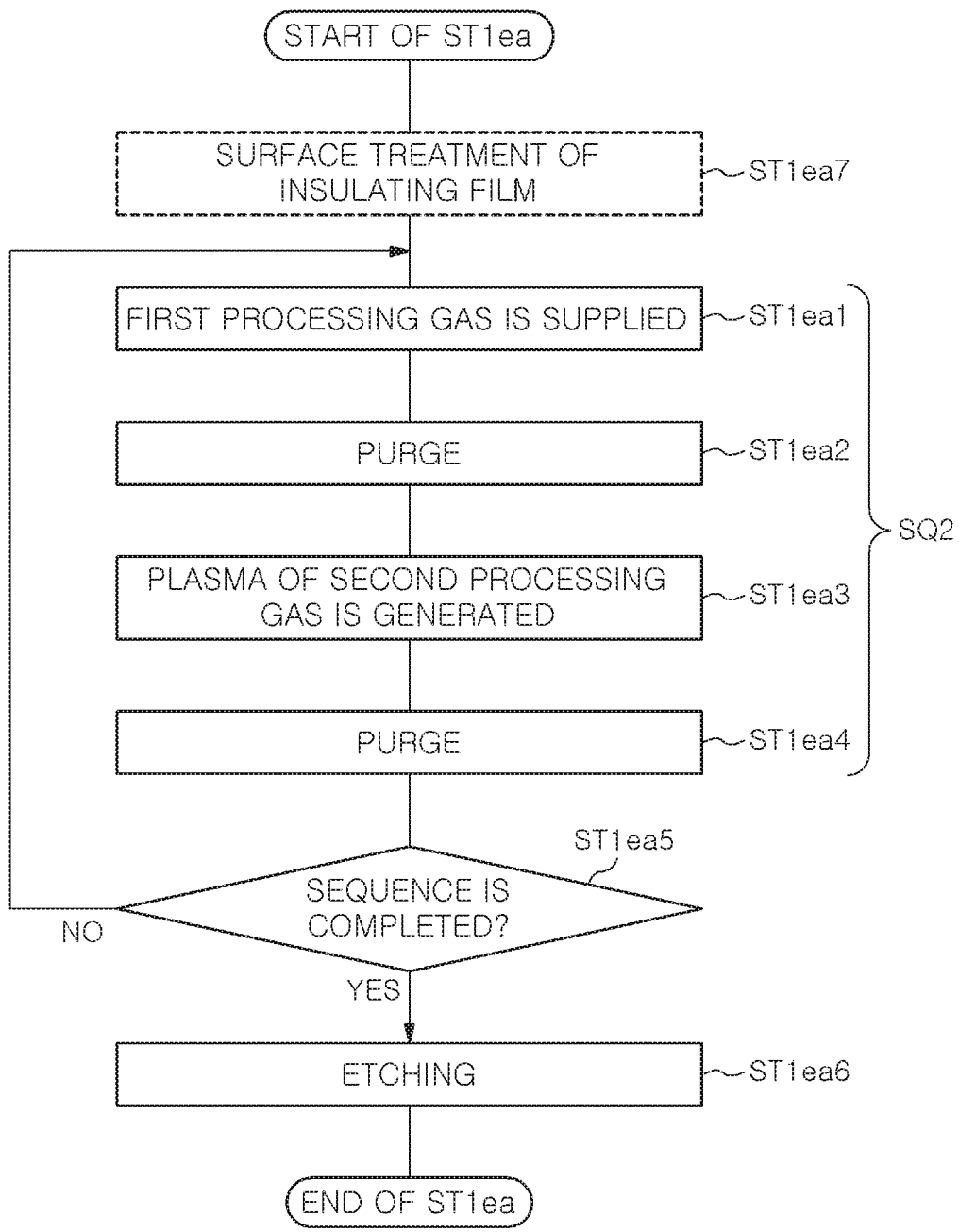
FIG. 7 is a flowchart showing a specific example of a step ST1ea shown in FIG. 6.

The step ST1ea will be described in detail. FIG. 7 is a flowchart showing a specific example of the step ST1ea shown in FIG. 6. The step ST1ea shown in FIG. 7 mainly includes a step (sequence SQ2) of forming a sacrificial film EX on the surface FC of the wafer W including the side surface SF of the via hole VH1 by using an ALD (Atomic Layer Deposition) method and a step (step ST1ea6) of exposing the bottom surface BF of the via hole VH1 by etching (etching back) the sacrificial film EX formed on the surface FC of the wafer W.

More specifically, as shown in FIG. 7, the step ST1ea includes a sequence SQ2 (third step), a step ST1ea5, and a step ST1ea6 (fourth step). The sequence SQ2 includes steps ST1ea1, ST1ea2, ST1ea3 and ST1ea4. In the step ST1ea, the sequence SQ2 is executed once or more. In the step ST1ea1, a first processing gas G1 containing silicon as a precursor gas is introduced into the processing chamber 12. In the step ST1ea1, plasma of the first processing gas G1 is not generated. The first processing gas G1 is an aminosilane-based gas. In the step ST1ea1, the first processing gas G1 of the aminosilane-based gas is supplied as a precursor gas into the processing chamber 12 from a gas source selected among the plurality of gas sources of the gas source group 40. In one embodiment, the first processing gas G1 is an aminosilane-based gas. As for the aminosilane-based gas, monoamino silane ($H_3$—Si—R (R being an amino group)) may be used.

The aminosilane-based gas may include aminosilane having 1 to 3 silicon atoms and may include aminosilane having 1 to 3 amino groups. The aminosilane having 1 to 3 silicon atoms may be monosilane having 1 to 3 amino groups, disilane having 1 to 3 amino groups, or trisilane having 1 to 3 amino groups. Further, the aminosilane may have an amino group that can be substituted. The aminosilane-based gas may be BTBAS (Bistertiarybutylaminosilane), BDMAS (Bisdimethylaminosilane), BDEAS (Bisdiethylaminosilane), DMAS (dimethylaminosilane), DEAS (diethylaminosilane), DPAS (Dipropylaminosilane), BAS (Butylaminosilane), BEMAS (Bisethylmethylaminosilane), or TDMAS (Tridimethylaminosilane). Moreover, the aminosilane-based gas may be an aminosilane-based gas having an alkynolosilane group, such as HDMS (hexamethyldisilazane), DMSDMA (Dimethylsilyldimethylamine), TMSDMA (Dimethilaminotrimethylsilane), TMMAS (Trimethylmethylaminosilane), TMICS (methyl(isocyanato) silane), TMSA (Trimethylsilylacetylene), or TMSC (Trimethylsilylcyanide). The precursor gas is not limited to the aminosilane-based gas, and may be a silicon alkoxide-based gas represented by TEOS (tetraethoxysilane). The precursor gas may contain halogenated silicon such as $SiCl_4$, $SiF_4$, or the like. In the step ST1ea1, plasma of the first processing gas G1 is not generated. However, the present disclosure is not limited thereto.

Figure 17A:
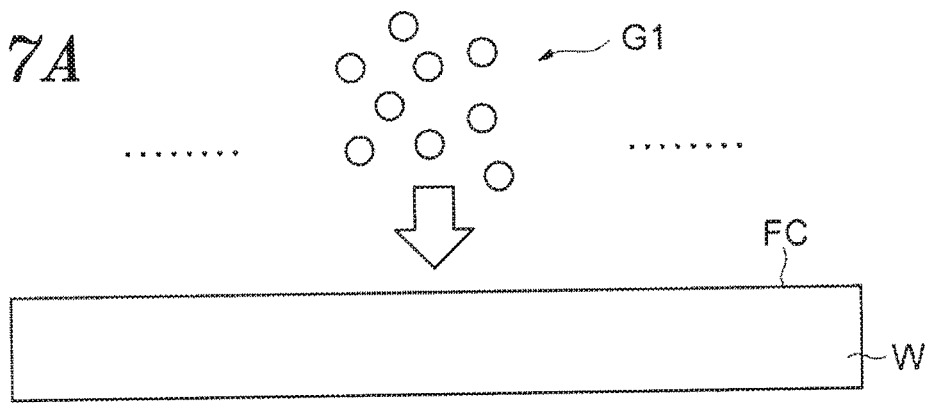
FIGS. 17A to 17C schematically show formation of a sacrificial film shown in FIG. 12.

As shown in FIG. 17A, molecules of the first processing gas G1 are adhered as reaction precursors to the surface FC of the wafer W. The molecules of the first processing gas G1 are adhered to the surface FC of the wafer W by chemical adsorption based on chemical bonding, and no plasma is used. Due to the adhesion of the molecules of the first processing gas G1 to the surface FC of the wafer W, a layer Ly1 of the reaction precursor is formed on the surface FC as can be seen from FIG. 17B. The material of layer Ly1 contains the molecules of the first processing gas G1.

After the step ST1ea1, the step ST1ea2 is executed. In the step ST1ea2, the space in the processing chamber 12 is purged. Specifically, the first processing gas G1 supplied in the step ST1ea1 is exhausted. In the step ST1ea2, an inert gas such as nitrogen gas or the like may be supplied as a purge gas into the processing chamber 12. In other words, the purging in the step ST1ea2 may be either a gas purging of flowing the inert gas in the processing chamber or a vacuum evacuation purging. In the step ST1ea2, molecules excessively adhered onto the wafer W can be removed. Accordingly, the layer Ly1 of the reaction precursor becomes an extremely thin monomolecular layer.

After the step ST1ea2, the step ST1ea3 is executed. In the step ST1ea3, plasma P1 of the second processing gas containing oxygen gas is generated in the processing chamber 12. In the step ST1ea3, the second processing gas containing oxygen gas is supplied into the processing chamber 12 from a gas source selected among the plurality of gas sources of the gas source group 40. The high frequency power is supplied from the first high frequency power supply 62. In this case, the bias power of the second high frequency power supply 64 may be applied. It is possible to generate the plasma by using only the second high frequency power supply 64 without using the first high frequency power supply 62. By operating the gas exhaust unit 50, the pressure in the space inside the processing chamber 12 is set to a predetermined level.

Figure 17B:
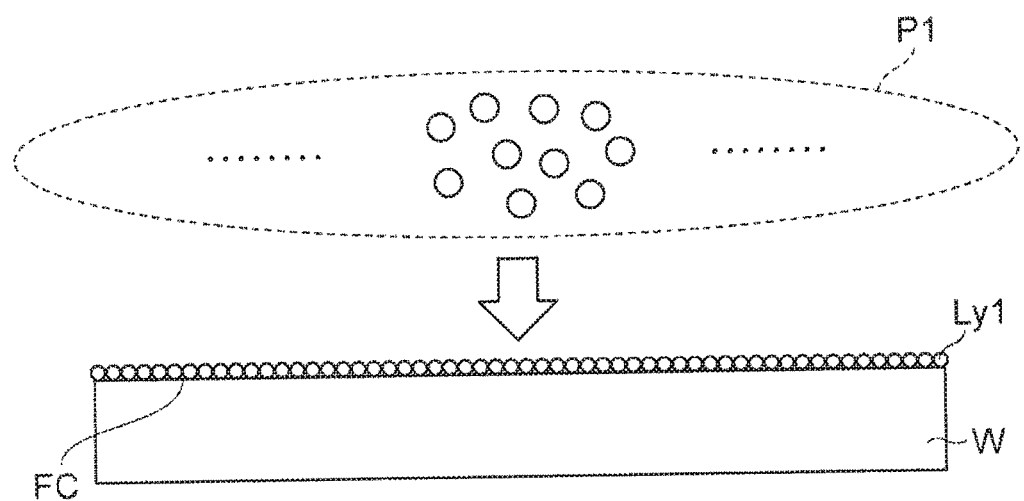
Figure 17C:
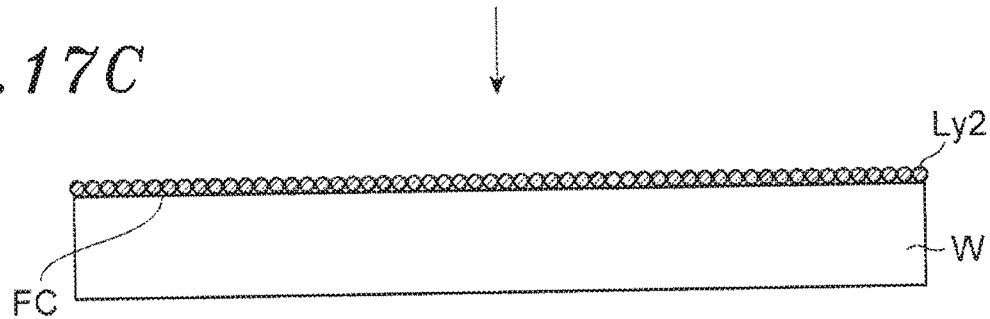

The molecules (molecules forming the monomolecular layer of the layer Ly1) adhered to the surface of the wafer W by the execution of the above-described step ST1ea1 include a bond between silicon and hydrogen. The bonding energy of silicon and hydrogen is lower than that of silicon and oxygen. Therefore, as shown in FIG. 17B, when the plasma P1 of the second processing gas containing oxygen gas is generated in the step ST1ea3, active species of oxygen, e.g., oxygen radicals, are generated, and hydrogen of the molecules forming the monomolecular layer of the layer Ly1 is substituted with oxygen. Accordingly, a layer Ly2 that is a silicon oxide film is formed as a monomolecular layer as can be seen from FIG. 17C.

After the step ST1ea3, the step ST1ea4 is executed. In the step ST1ea4, the space in the processing chamber 12 is purged. Specifically, the second processing gas supplied in the step ST1ea3 is exhausted. In the step ST1ea4, an inert gas such as nitrogen gas or the like may be supplied as a purge gas into the processing chamber 12. In other words, the purging in the step ST1ea4 may be either a gas purging of flowing the inert gas in the processing chamber 12 or a vacuum evacuation purging.

In the above-described sequence SQ2, the purging is performed in the step ST1ea2. In the step ST1ea3 following the step ST1ea2, hydrogen of the molecules forming the layer Ly1 is substituted with oxygen. Therefore, similarly to the ALD method, the layer Ly2 of the silicon oxide film can be conformally formed with a uniform thickness on the surface FC of the wafer W by executing the sequence SQ2 once.

After the sequence SQ2, the step ST1ea5 is executed. In the step ST1ea5, it is determined whether or not the execution of the sequence SQ2 has been completed. Specifically, in the step ST1ea5, it is determined whether or not the repetition number of the sequence SQ2 has reached a predetermined value. By determining the repetition number of the sequence SQ2, the thickness of the sacrificial film EX formed on the surface FC of the wafer W is determined. In other words, the thickness of the sacrificial film EX finally formed on the surface FC of the wafer W is determined by multiplying the film thickness of the silicon oxide film formed by executing the sequence SQ2 once by the repetition number of the sequence SQ2. Therefore, the repetition number of the sequence SQ2 is set depending on a desired thickness of the sacrificial film EX formed on the surface FC of the wafer W.

When it is determined in the step ST1ea5 that the repetition number of the sequence SQ2 has not reached the predetermined value (step ST1ea5: NO), the execution of the sequence SQ2 is repeated again. On the other hand, when it is determined in step ST1ea5 that the repetition number of the sequence SQ2 has reached the predetermined value (step ST1ea5: YES), the execution of the sequence SQ2 is completed and the step ST1ea6 is executed. Accordingly, as shown in FIG. 12, the sacrificial film EX that is a silicon oxide film is formed on the surface FC of the wafer W. In other words, by repeating the sequence SQ2 a predetermined number of times, the sacrificial film EX having a predetermined film thickness is uniformly and conformally formed on the surface FC of the wafer W.

Figure 13:
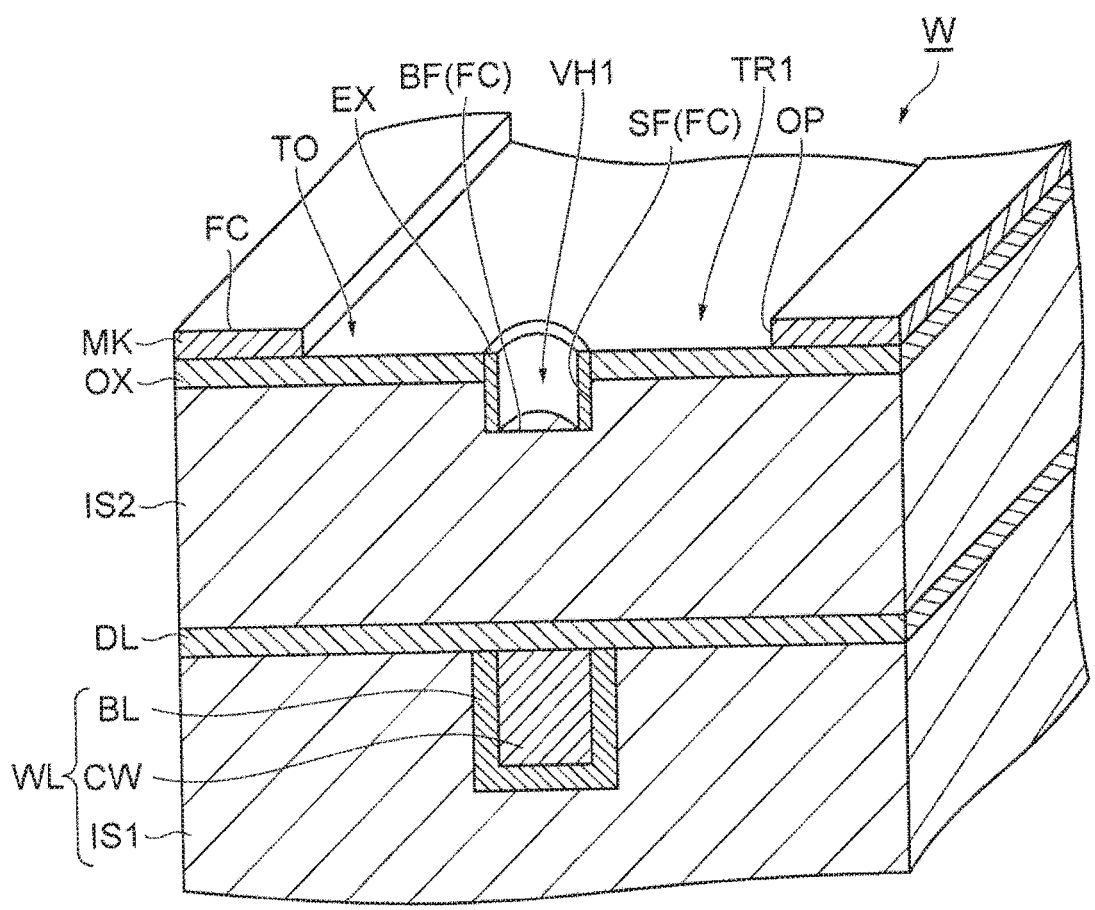

In the step ST1ea6 following the step ST1ea5 (step ST1ea5: YES), the sacrificial film EX is etched. By executing the step ST1ea6, the sacrificial film EX is removed except a portion covering the side surface SF of the via hole VH1. An anisotropic etching condition is required to selectively remove the sacrificial film EX except the portion covering the side surface SF of the via hole VH1. Therefore, in the step ST1ea6, a processing gas containing a fluorocarbon gas is supplied into the processing chamber 12 from a gas source selected among the plurality of gas sources of the gas source group 40. The high frequency power is supplied from the first high frequency power supply 62. The high frequency bias power is supplied from the second high frequency power supply 64. The gas exhaust unit 50 is operated to set the pressure in the space inside the processing chamber 12 to a predetermined level. Accordingly, plasma of a fluorocarbon gas is generated. Fluorine-containing active species in the generated plasma are attracted by the high frequency bias power in a direction crossing the wafer W (more specifically, in a direction substantially perpendicular to the bottom surface BF of the via hole VH1 and substantially parallel to the side surface SF of the via hole VH1), thereby selectively etching the sacrificial film EX except the portion covering the side surface SF of the trench TR. As a result, as shown in FIG. 13, the sacrificial film EX is selectively removed except the portion covering the side surface SF of the via hole VH1, and the portion of the sacrificial film EX which covers the side surface SF of the via hole VH1 remains.

Figure 14:
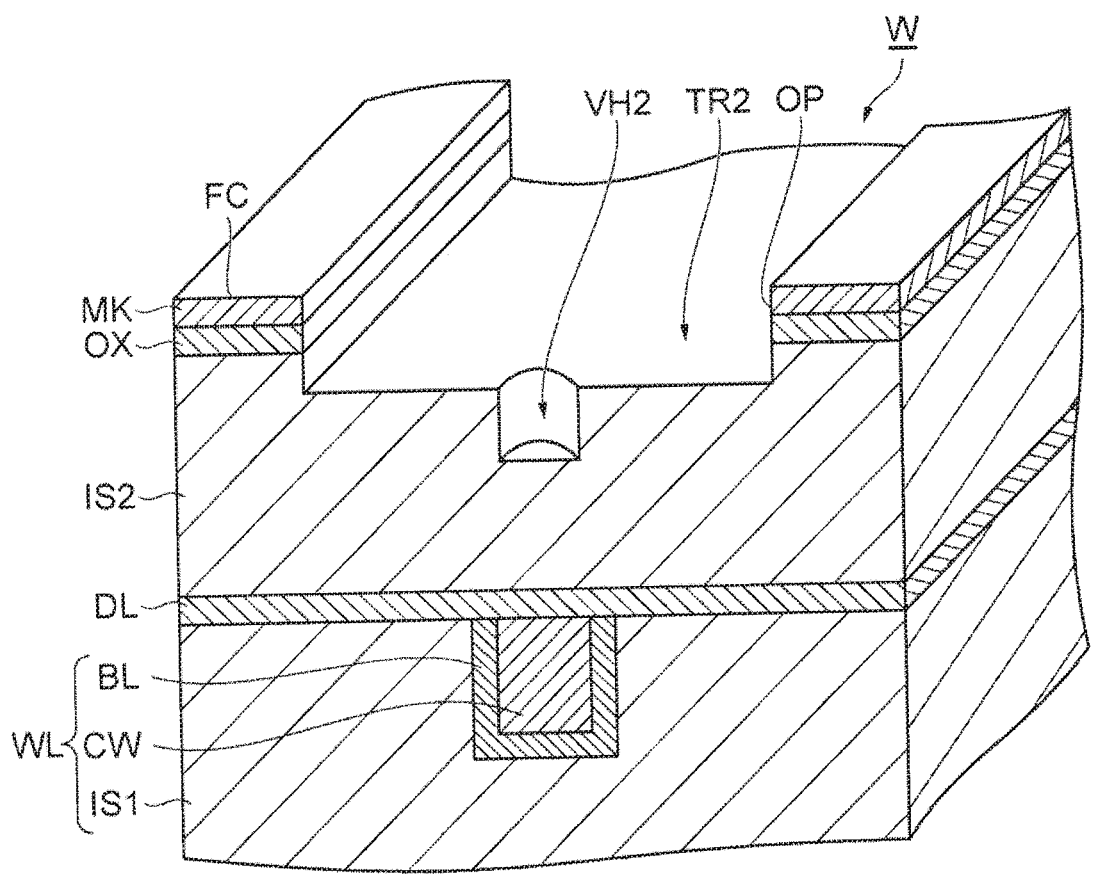

Referring back to FIG. 6, after the step ST1ea, the step ST1eb is executed. In the step ST1eb, as shown in FIG. 14, the sacrificial film EX, the oxide film OX, and the second insulating film IS2 are etched. Accordingly, a via hole VH2 is formed at a position deeper than the bottom surface BF of the via hole VH1, and the sacrificial film EX is removed from the trench TR1 and the via hole VH1. Therefore, a processing gas is supplied into the processing chamber 12 from a gas source selected among the plurality of gas sources of the gas source group 40. In the step ST1eb of one example, a process gas containing a fluorocarbon gas is supplied into the processing chamber 12. As for the fluorocarbon gas, $CF_4$ gas and $C_4F_8$ gas may be used. In the step ST1eb, the gas exhaust unit 50 is operated to set the pressure in the processing chamber 12 to a predetermined level. In the step ST1eb, the first high frequency power from the first high frequency power supply 62 and the second high frequency power from the second high frequency power supply 64 are supplied to the lower electrode LE.

In the step ST1eb, plasma of the processing gas is generated, and the sacrificial film EX, the oxide film OX, and the second insulating film IS2 are etched. In the step ST1eb, the trench TR1 formed by the opening OP of the metal mask MK and the opening TO of the surface of the oxide film OX is etched in a deeper trench shape, and the sacrificial film EX is completely removed. Further, the second insulating film IS2 is etched to a position deeper than the depth of the via hole VH1 in the film thickness direction of the second insulating film IS2. When the step ST1eb is completed, the depth of the trench TR1 becomes deeper and the via hole VH1 disappears by the etching. As a result, as shown in FIG. 14, the trench TR2 having the width of the opening OP is formed from the trench TR1, and the sacrificial film EX is completely removed (at least the sacrificial film EX is removed from the via hole VH1). In addition, the via hole VH1 disappears and a via hole VH2 is newly formed at a part of the trench TR2.

Conditions for removing the sacrificial film EX from the via hole VH1 in the step ST1eb will be described in detail. When the step ST1eb is started, the sacrificial film EX is adhered only to the side surface SF of the via hole VH1 at least inside the via hole VH1, as can be seen from FIG. 13. The following conditions (i) and (ii) are applied.

Condition (i): The duration of the etching of the sacrificial film EX and the second insulating film IS2 in the step ST1eb is greater than or equal to a quotient obtained by dividing the depth of the via hole VH1 (length of the side surface SF of the via hole VH1 from the bottom surface BF of the via hole VH1 to the opening of the via hole VH1) by the etching rate of the sacrificial film EX.

Condition (ii): The etching rate of the sacrificial film EX is substantially the same as that of the second insulating film IS2.

The above conditions (i) and (ii) will be described more specifically. On the assumption that the duration of the etching of the sacrificial film EX and the second insulating film IS2 in the step ST1eb is ET[s]; the depth of the via hole VH1 (the length of the side surface SF of the via hole VH1 from the bottom surface BF of the via hole VH1 to the opening of the via hole VH1) is D[nm]; the etching rate of the sacrificial film EX is set to ER1 [nm/s]; and the etching rate of the second insulating film IS2 is ER2 [nm/s], the condition (i) is equivalent to ET≥(D/ER1)[s] and the condition (ii) is equivalent to ER1/ER2=1±Δ (Δ being a minute value).

When the duration of the etching of the sacrificial film EX and the second insulating film IS2 in the step ST1eb is smaller than the quotient obtained by dividing the depth of the via hole VH1 (the length of the side surface SF of the via hole VH1 from the bottom surface BF of the via hole VH1 to the opening of the via hole VH1) by the etching rate of the sacrificial film EX ((ET<(D/ER1)[s]), the sacrificial film EX in the via hole VH1 (the sacrificial film EX attached to the side surface SF of the via hole VH1) is not completely removed by the etching in the step ST1eb, and the sacrificial film EX remains on the side surface SF of the via hole VH1. In that case, the dielectric constant of the second insulating film IS2 is increased by the sacrificial film EX remaining on the side surface SF of the via hole VH1 and, thus, an inter-wiring parasitic capacitance may be increased.

Even when the duration of the etching of the sacrificial film EX and the second insulating film IS2 in the step ST1eb is greater than or equal to the quotient obtained by dividing the depth of the via hole VH1 (the length of the side surface SF of the via hole VH1 from the bottom surface BF of the via hole VH1 to the opening of the via hole VH1) by the etching rate of the sacrificial film EX (ET≥(D/ER1)[s]), if the etching rate of the sacrificial film EX is greater than that of the second insulating film IS2 (ER1/ER2>>1), the sacrificial film EX attached to the side surface SF of the via hole VH1 is removed at a relatively early timing in the step ST1eb. Therefore, a desired cross sectional shape of the via hole VH is not obtained, and the via hole VH may have a complex (distorted) cross sectional shape such as a stepped shape or the like.

Even when the duration of the etching of the sacrificial film EX and the second insulating film IS2 in the step ST1eb is greater than or equal to the quotient obtained by dividing the depth of the via hole VH1 (the length of the side surface SF of the via hole VH1 from the bottom surface BF of the via hole VH1 to the opening of the via hole VH1) by the etching rate of the sacrificial film EX (ET≥(D/ER1)[s]), if the etching rate of the second insulating film IS2 is greater than that of the sacrificial film EX (ER1/ER2<<1), it is difficult to remove the sacrificial film EX attached to the side surface SF of the via hole VH1 by performing the etching in the step ST1eb. Therefore, the sacrificial film EX remains on the side surface SF of the via hole VH1 even after the step ST1eb is completed. Accordingly, a desired cross sectional shape of the via hole VH1 is not obtained, and the via hole VH1 may have a complex (distorted) cross sectional shape, e.g., with a protrusion or the like.

After the step ST1eb, the step ST1ec is executed. In the step ST1ec, it is determined whether or not the sequence SQ1 including the step ST1ea and the step ST1eb has been completed. When the sequence SQ1 needs to be executed again (step ST1ec: NO), the step ST1ea and the step ST1eb are executed again. When the sequence SQ1 has been completed (Step ST1ec: YES), the step ST1e is completed. In other words, in the step ST1e, the sequence SQ1 is repeatedly executed until the via hole VH reaches the diffusion barrier film DL, as can be seen from FIG. 15.

When the sequence SQ1 is executed only once in the step ST1e, the via hole VH is formed by executing the step ST1eb only once and, thus, the sacrificial film EX formed by executing the step ST1ea once needs to have a thickness that can define a final width of the via hole VH (the width of the via hole VH that has reached the diffusion barrier film DL). Depending on various dimensions such as the width of the opening MO of the resist mask RM, the final width of the via hole VH, and the like, the sacrificial film EX formed in the step ST1ea may become relatively thick. In that case, the radicals used for etching the second insulating film IS2 may not reach the bottom surface of the via hole VH and the etching may be stopped. On the other hand, in the method MT in which the sequence SQ1 can be repeatedly executed, even in the opening MO having a relatively large width, it is possible to suppress the thickness of the sacrificial film EX formed by executing the step ST1ea once such that the etching is not stopped and to reduce the width of the via hole VH in a stepwise manner while extending the via hole VH toward the diffusion barrier film DL by executing the sequence SQ1 multiple times. Therefore, the via hole VH can be formed to have a final width (width of the via hole VH that has reached the diffusion barrier film DL) without stopping the etching.

When the second insulating film IS2 is made of a porous material having pores, in the step ST1ea, a process of sealing the pores in the surface layer of the porous material exposed to the surface (the side surface SF and the bottom surface BF) of the via hole VH1 can be performed before the sacrificial film EX is formed. Especially, as shown in FIG. 7, in the case of using the ALD method for the execution of the step ST1$ea$, when the layer Ly1 of the reaction precursor is formed on the surface of the via hole VH1, the reaction precursor is absorbed into the pores of the second insulating film IS2, which may result in an increase in the dielectric constant of the second insulating film IS2. Therefore, it is preferable to perform surface treatment of blocking the pores of the second insulating film IS2 on the surface of the second insulating film IS2 (the surface of the via hole VH1) so that the absorption of the reaction precursor can be suppressed before the layer Ly1 of the reaction precursor is formed. When the sequence SQ1 is repeatedly executed multiple times, the surface of the second insulating film IS2 is exposed at the sidewall of the trench TR2 as can be seen from FIG. 14. In that case as well, it is preferable to perform surface treatment of blocking the pores of the second insulating film IS2 on the surface of the second insulating film IS2 (the surface of the via hole VH1 and the surface of the trench TR2) so that the absorption of the reaction precursor can be suppressed before the layer Ly1 of the reaction precursor is formed. Therefore, as shown in FIG. 7, a step ST1$ea$7 of performing surface treatment (sealing treatment) of the second insulating film IS2 may be executed before the sequence SQ2. As for the sealing treatment, an ALD method or a CVD method using an organic silicon compound or an organic solvent as a processing gas is used. In this case, a material containing silicon or an organic substance fills the pores and, thus, the pores can be blocked. The dielectric constant of the surface layer of the second insulating film IS2 that has been subjected to the sealing treatment is slightly increased. Accordingly, it is preferable to remove the material blocking the pores by heat treatment, wet cleaning or the like and then form pores again after the sacrificial film EX is removed and the surface layer of the second insulating film IS2 that has been subjected to the sealing treatment is exposed by the etching of the insulating film in the step ST1$e$, specifically, by the etching of the second insulating film IS2 and the sacrificial film EX in the step ST1$b$.

In the step ST1$ea$7, the surface of the second insulating film IS2 (the surface of the trench TR) can be covered with, e.g., a dense dielectric film. Due to the presence of the dielectric film, the absorption of the reaction precursor can be suppressed. In the step ST1$ea$7, the surface of the second insulating film IS2 (the surface of the trench TR) can be processed with He and then subjected to treatment using a gaseous mixture containing $NH_3$ and Ar. By performing the treatment, Si—N bonds and C—N bonds are generated on the surface of the second insulating film IS2 and, thus, the pores on the surface of the second insulating film IS2 can be sealed.

When the step ST1$e$ is completed, the step ST1 is also completed. Therefore, the step ST2 shown in FIG. 1 is executed after the step ST1. Referring back to FIG. 1, in the step ST2, the diffusion barrier film DL is etched through the via hole VH formed in the step ST1 until the diffusion barrier film DL reaches the wiring layer WL (in particular, the wiring CW).

In the step ST2, the diffusion barrier film DL is etched until the wiring CW is exposed, so that plasma of the processing gas including a fluorocarbon gas and/or a hydrofluorocarbon gas is generated. Therefore, a processing gas is supplied into the processing chamber 12 from a gas source selected among the plurality of gas sources of the gas source group 40. The processing gas may include one or more gases among of $CF_4$ gas, $CHF_3$ gas, $C_4F_8$ gas, $C_4F_6$ gas, $CH_2F_2$ gas, and $CH_3F$ gas. The processing gas may include a rare gas, nitrogen gas, and oxygen gas. For example, the processing gas includes $CF_4$ gas, $C_4F_8$ gas, Ar gas, nitrogen gas, and oxygen gas. In the step ST2, the gas exhaust unit 50 is operated to set the pressure in the processing chamber 12 to a predetermined level. In the step ST2, the first high frequency power from the first high frequency power supply 62 and the second high frequency power from the second high frequency power supply 64 are supplied to the lower electrode LE.

Figure 16:
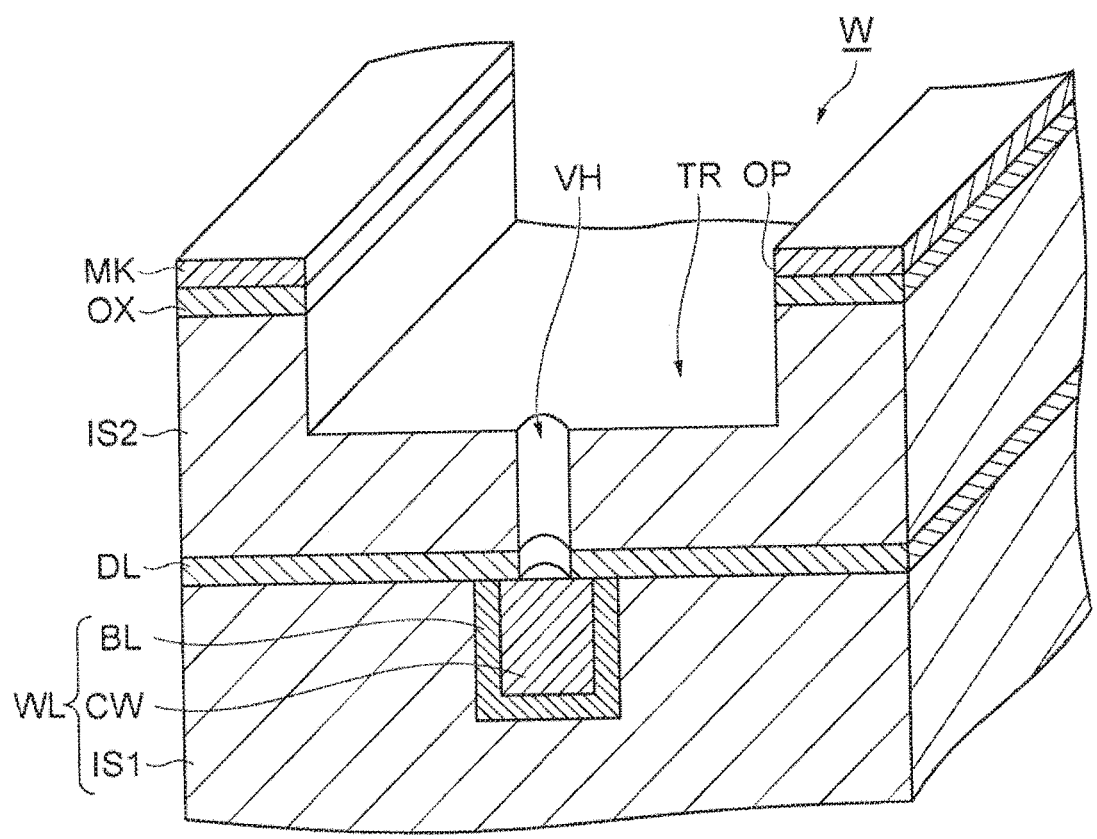

In the step ST2, the plasma of the processing gas is generated, and the diffusion barrier film DL is etched. As a result, as shown in FIG. 16, the via hole VH is extended to the surface of the wiring CW. After the step ST2 is executed, copper on the surface of the wiring CW is transformed to copper fluoride. In order to modify the transformed copper surface to copper, the transformed copper surface may be exposed to plasma treatment using hydrogen gas or the like after the step ST2 is executed. The modified surface may be removed by wet cleaning. After the step ST2, a step ST3 is executed. In the step ST3, the metal mask MK is removed, and a metal such as Cu or the like fills the trench TR and the via hole VH.

In accordance with the above-described method MT, after the sacrificial film EX is formed on the side surface SF of the via hole VH1 and the trench formed on the second insulating film IS2 (after the step ST1$ea$), the second insulating film IS2 is etched to form a via hole VH2 at a deeper position than the bottom surface BF of the via hole VH1. Therefore, the via hole VH2 is formed in a state where an opening diameter of the via hole VH1 has been reduced by the sacrificial film EX, which makes it possible to form a fine via hole VH. Since the sacrificial film Ex on the side surface SF of the via hole VH1 and the trench (more specifically, the sacrificial film EX in the trench) is removed during the etching of the second insulating film IS2, the increase in the dielectric constant of the second insulating film IS2 which is caused by the sacrificial film EX can be suppressed. In the step ST1$ea$, the sacrificial film EX is conformally formed. When the sacrificial film EX is not conformal, the film thicknesses of the upper portion of the trench TR1 and the upper portion of the via hole VH1 may become thicker than those of the side portion and the bottom portion of the trench TR1 and the side portion and the bottom portion of the via hole VH1. In other words, a so-called overhang shape may be formed. In this case, it is expected that the size of the opening of the trench TR1 and the opening of the via hole VH1 become extremely small to hinder the etching. Since, however, the sacrificial film EX conformally formed in the step ST1$ea$ is used, it is possible to perform precise etching by using the sacrificial film EX in the step ST1$eb$. Although it is considered to use the sacrificial film EX having low-k characteristics, even if the sacrificial film having a low dielectric constant is used, the second insulating film IS2 can be etched in the step ST1$eb$. Further, it is possible to prevent the second insulating film IS2 having a low dielectric constant from being exposed to the atmosphere from the step ST1$ea$ to the step ST1$eb$. Since the steps ST1$ea$ to ST1$eb$ are executed in a single processing chamber 12, it is possible to reliably prevent the second dielectric film IS2 having a low dielectric constant from being exposed to the atmosphere.

When the second insulating film IS2 is made of a porous material having pores, the pores are sealed before the sacrificial film EX is formed by executing the step ST1$ea$7 shown in FIG. 7. Therefore, it is possible to minimize changes in the characteristics (particularly the dielectric constant) of the second insulating film IS2 due to the absorption of the material (reaction precursor) of the sacrificial film EX into the pores during the formation of the sacrificial film EX. Further, it is possible to suppress the thickness of the sacrificial film EX formed by executing the step ST1ea once such that the etching is not stopped and to reduce the width of the via hole VH in a stepwise manner while extending the via hole VH toward the diffusion barrier film DL. Accordingly, the via hole VH can be formed to have a final width (width of the via hole VH that has reached the diffusion barrier film DL) without stopping the etching.

The duration (ET[s]) of the etching of the sacrificial film EX and the second insulating film IS2 in the step ST1eb is greater than or equal to a quotient obtained by dividing the depth (D[nm]) of the trench TR by the etching rate (ER1 [nm/s]) of the sacrificial film EX (ET≥(D/ER1)[s]). The etching rate (ER1 [nm/s]) of the sacrificial film EX and the etching rate (ER2 [nm/s]) of the insulating film are substantially the same (ER1/ER2=1±Δ (Δ being a minute value)). By controlling the duration (ET[s]) of the etching in the step ST1eb, it is possible to remove the sacrificial film EX having a length corresponding to the depth (D[nm]) of the trench TR on the side surface SF of the trench TR during the etching in the step ST1eb.

While the principles of the present disclosure have been described with respect to the embodiments, it will be apparent to those skilled in the art that the present disclosure may be modified in arrangement and detail without departing from the principles. The present disclosure is not limited to the specific configuration disclosed in the above embodiments. Therefore, all modifications and changes made within the scope of the claims and the spirit thereof are claimed.

What is claimed is:

1. A method for processing a target object including a wiring layer having a wiring, a diffusion barrier film provided on the wiring layer, an insulating film provided on the diffusion barrier film, and a metal mask provided on the insulating film and having an opening, the insulating film having a trench formed at a part of a portion exposed through the opening and a first via hole provided at a part of the trench, the method comprising:
   a first step of forming conformally a sacrificial film having a predetermined film thickness on the trench and a side surface of the first via hole of the target object; and
   a second step of forming a second via hole at a deeper portion than a bottom surface of the first via hole by etching the sacrificial film and the insulating film and removing the sacrificial film from the trench and the first via hole.

2. The method of claim 1, wherein when the second step is completed, the trench becomes deeper by the etching and the first via hole disappears by the etching.

3. The method of claim 1, wherein the first step includes:
   a third step of forming the sacrificial film on a surface of the target object including a side surface of the trench by using an atomic layer deposition (ALD) method; and
   a fourth step of exposing a bottom surface of the trench by etching the sacrificial film formed on the surface of the target object.

4. The method of claim 1, wherein the insulating film is a silicon oxide film, a silicon-containing film having low-k characteristics, or a laminated film of a silicon oxide film and a silicon-containing film having low-k characteristics.

5. The method of claim 1, wherein the sacrificial film has low-k characteristic.

6. The method of claim 1, wherein the sacrificial film is a silicon oxide film.

7. The method of claim 1, wherein the first step and the second step are executed in a consistent vacuum environment.

8. The method of claim 1, wherein the first step and the second step are executed in a single processing chamber.

9. The method of claim 1, wherein when the insulating film is made of a porous material having pores, in the first step, a process of sealing the pores on a surface layer of the porous material exposed on a surface of the trench is performed before the sacrificial film is formed.

10. The method of claim 1, wherein a sequence including the first step and the second step is repeatedly executed until the second via hole reaches the diffusion harrier film.

11. The method of claim 1, wherein duration of the etching of the sacrificial film and the insulating film performed in the second step is greater than or equal to a quotient obtained by dividing a depth of the trench by an etching rate of the sacrificial film, and the etching rate of the sacrificial film is substantially the same as the etching rate of the insulating film.

* * * * *